US006414679B1

(12) United States Patent
Miodonski et al.

(10) Patent No.: US 6,414,679 B1
(45) Date of Patent: Jul. 2, 2002

(54) ARCHITECTURE AND METHODS FOR GENERATING AND DISPLAYING THREE DIMENSIONAL REPRESENTATIONS

(75) Inventors: Michael S. Miodonski; Sandor Bank, both of Mississauga (CA)

(73) Assignee: CyberWorld International Corporation, Mississauga (CA)

( * ) Notice: Subject to any disclaimer, the term of this patent is extended or adjusted under 35 U.S.C. 154(b) by 0 days.

(21) Appl. No.: 09/183,793

(22) Filed: Oct. 30, 1998

Related U.S. Application Data

(60) Provisional application No. 60/103,710, filed on Oct. 8, 1998.

(51) Int. Cl.[7] .............................................. G06T 17/00
(52) U.S. Cl. ........................ 345/420; 345/850; 345/854; 707/5
(58) Field of Search ................................. 345/419, 355, 345/420, 850, 854; 706/55; 707/5, 10

(56) References Cited

U.S. PATENT DOCUMENTS

| | | | | |
|---|---|---|---|---|
| 4,905,163 A | * | 2/1990 | Garber et al. .................. | 706/55 |
| 5,671,381 A | | 9/1997 | Strasnick et al. ............ | 345/355 |
| 5,808,613 A | | 9/1998 | Marrin et al. ................ | 345/355 |
| 5,861,885 A | | 1/1999 | Strasnick et al. ........... | 345/355 |
| 5,880,733 A | | 3/1999 | Horvitz ........................ | 345/355 |
| 5,983,220 A | * | 11/1999 | Schmitt .......................... | 707/5 |
| 6,073,115 A | | 6/2000 | Marshall ..................... | 345/355 |
| 6,084,590 A | * | 7/2000 | Robotham et al. .......... | 345/419 |
| 6,088,698 A | * | 7/2000 | Lipkin .......................... | 707/10 |
| 6,105,036 A | * | 8/2000 | Henckel ...................... | 345/355 |
| 6,111,578 A | | 8/2000 | Tesler .......................... | 345/355 |
| 6,219,045 B1 | | 4/2001 | Leahy et al. ................ | 345/331 |

FOREIGN PATENT DOCUMENTS

| | | | | |
|---|---|---|---|---|
| EP | 0694829 A | 1/1996 | ........... | G06F/3/023 |
| EP | WO0926629 A1 | 6/1999 | | |
| WO | WO92/09963 | 6/1992 | | |
| WO | WO96/23280 | 8/1996 | | |
| WO | WO98/10353 | 3/1998 | ........... | G06F/3/033 |
| WO | WO98/10356 | 3/1998 | | |

OTHER PUBLICATIONS

M. Crossley, et al., "Three–Dimensional Internet Developments",BT Technol J vol. 15, No. 2, Apr. 1997.

Funkhouser et al., of the University of California at Berkeley "*Management of Large Amounts of Data In Interactive Building Walkthroughs*", Proceedings 1992 Symposium on Interactive 3D Graphics, Cambridge, Massachusetts, Mar. 29–Apr. 1, 1992, pp. 11–20.

\* cited by examiner

*Primary Examiner*—Mark Zimmerman
*Assistant Examiner*—Kimbinh T. Nguyen
(74) *Attorney, Agent, or Firm*—Beyer, Weaver & Thomas, LLP

(57) ABSTRACT

An apparatus and method are disclosed for generating and displaying three dimensional representations. In one embodiment, a data structure is disclosed. The data structure is suitable for storing information useful in constructing a three dimensional representation of information in a viewable construction site that is conceptually divided into a multiplicity of locations. The data structure is embodied in a computer readable media and includes a plurality of attribute maps. Each attribute map is arranged to associate specific attribute instances with specific locations within the construction site. The data structure also includes a plurality of attribute descriptors. Each attribute descriptor is associated with one of the attribute maps and is arranged to reference specific attribute instances associated with the associated attribute map.

30 Claims, 36 Drawing Sheets

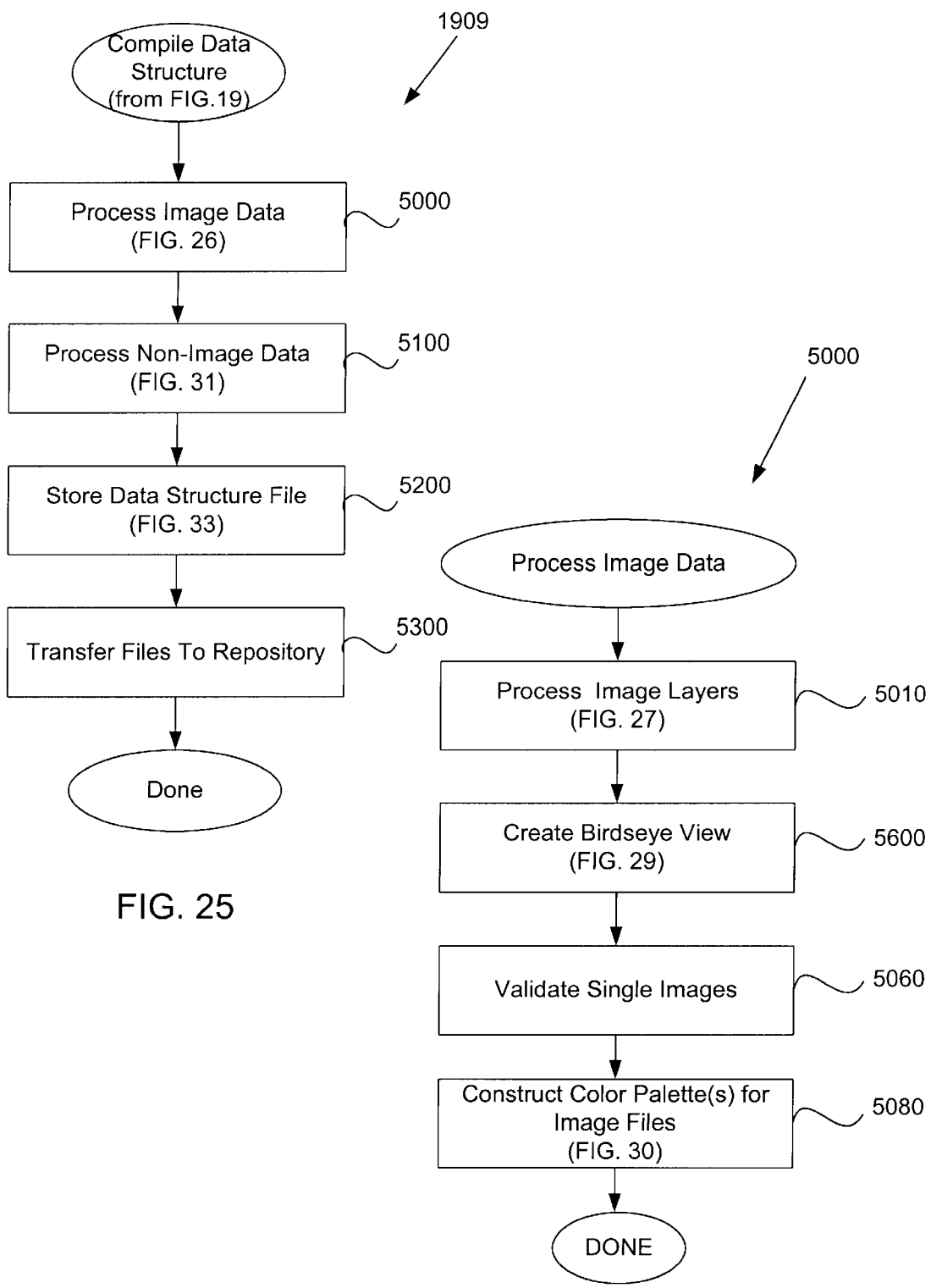

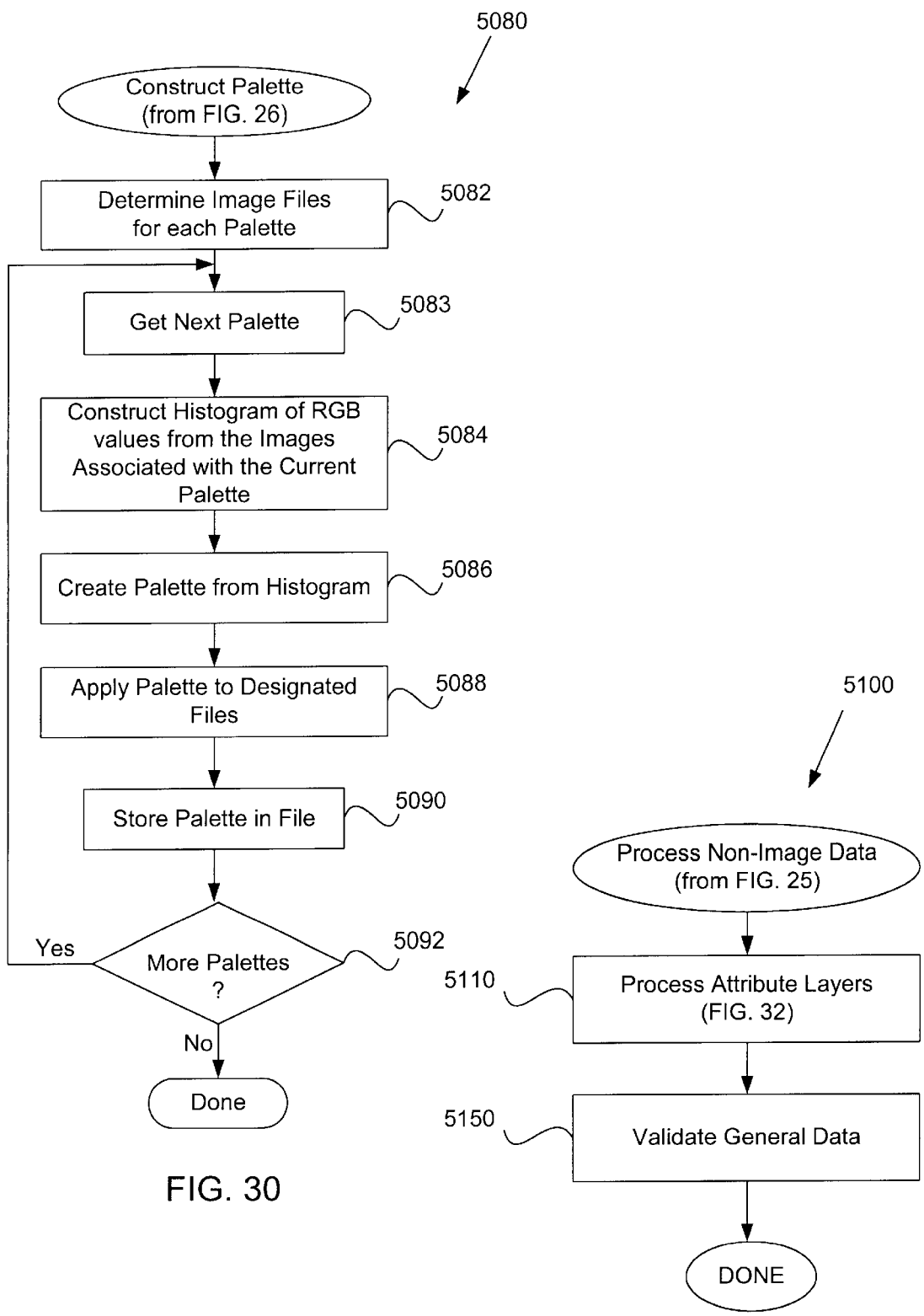

ARCHITECTURE AND METHODS FOR GENERATING AND DISPLAYING THREE DIMENSIONAL REPRESENTATIONS

CROSS REFERENCE TO RELATED APPLICATIONS

This application claims priority to Provisional U.S. Patent Application, having application No. 60/103,710 filed Oct. 8, 1998 entitled, "Architecture and Methods for Generating and Displaying Three Dimensional Representations" by Miodonski, et al. This applications is related to concurrently filed U.S. patent, application Ser. No. 09/183,642 entitled, "Systems and Methods for Displaying Three Dimensional Representations" by Bank, et al., which has assignment rights in common. These two related applications are incorporated herein by reference for all purposes.

BACKGROUND OF THE INVENTION

The present invention relates generally to mechanisms for generating and displaying three dimensional representations or virtual reality worlds. That is, the present invention relates to methods and apparatus for building and viewing such three dimensional worlds.

One conventional mechanism for creating and displaying three dimensional (3D) worlds implements virtual reality modeling language (VRML). Conventionally, VRML is used to "model" three dimensional worlds using simple polygon structures. The first version of VRML allows for the creation of virtual worlds with limited interactive behavior and is currently the most popular foundation for creating interactive 3D multimedia on the Internet. As will be appreciated by those skilled in the art, International Standard ISO/IEC 14772 describes the standard VRML file format.

Worlds created using VRML can contain objects which have hyper-links to other worlds, HTML documents or other valid MIME types. When the user selects an object with a hyper-link, the appropriate MIME viewer is launched. When the user selects a link to a VRML document from within a correctly configured WWW browser, a VRML viewer is launched.

Although the conventional VRML viewer work well under certain conditions, it has associated disadvantages. For example, if the 3D world is relatively large, it is difficult to orient oneself within the world. That is, as one navigates within the 3D world, it is easy to get lost. This is partially because standard VRML viewers do not provide any frame of reference for where you are currently located within the VRML 3D world. Additionally, even when a 3D world is relatively small in size, navigational problems may still arise when certain portions of the 3D world have a similar appearance. In this case, it is especially difficult to distinguish between similar portions of the world and navigate to a desired location of the 3D world.

Navigational problems are compounded since each VRML world may have an infinite size. In other words, there are no constraints placed on how large a VRML world may be. Thus, VRML world builders may build relatively large and complex worlds. As VRML worlds becomes larger and more complex, it becomes increasingly more difficult to view and navigate through such gargantuan worlds. Finally, when a VRML world is relatively complex, it requires a relatively long rendering time since each portion of the 3D world is analyzed and rendered from polygon structures.

In view of the foregoing, there is a need for improved mechanism for generating 3D worlds and viewing and navigating through such 3D worlds.

SUMMARY OF THE INVENTION

Accordingly, the present invention provides an apparatus and method for generating and displaying three dimensional representations. In one embodiment, a data structure is disclosed. The data structure is suitable for storing information useful in constructing a three dimensional representation of information in a viewable construction site that is conceptually divided into a multiplicity of locations. The data structure is embodied in a computer readable media and includes a plurality of attribute maps. Each attribute map is arranged to associate specific attribute instances with specific locations within the construction site. The data structure also includes a plurality of attribute descriptors. Each attribute descriptor is associated with one of the attribute maps and is arranged to reference specific attribute instances associated with the associated attribute map.

In an alternative embodiment, each attribute map has a plurality of identifiers, wherein each identifier is associated with a specific location within the construction site and a specific attribute instance, and each attribute descriptor is formatted to match specific identifiers of the associated attribute map to specific attribute instance. Additionally, specific identifiers are matched within the descriptors to specific attribute instances located within the descriptors, and other specific identifiers are matched within the descriptor to specific indexes that reference specific attribute instances located outside of the descriptors.

In yet another embodiment, a data structure for holding information that is convertible into a three dimensional representation within an audiovisual system is disclosed. The three dimensional representation includes a plurality of sections. The data structure has a mapping portion that associates selected sections of the three dimensional representation with selected section attribute instances. At least one of the section attribute instances is viewable or audible within the audiovisual system. The data structure further includes a general portion that associates general attributes with the three dimensional representation, at least one of the general attributes being viewable or audible within the audiovisual system.

In a method aspect of the invention, a method for generating a three dimensional representation in a viewable construction site having a plurality of sections is disclosed. Each section has a plurality of associated attribute layer. A new construction site is instantiated; a first attribute layer is selected; and a first palette that includes a first plurality of attribute instances associated with the first attribute layer is displayed. A first attribute instance from the first palette is selected; and the first attribute instance is painted on one or more sections of the construction site.

These and other features and advantages of the present invention will be presented in more detail in the following specification of the invention and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which:

FIG. 25 a flowchart illustrating the operation of FIG. 19 of compiling a completed construction site in accordance with one embodiment of the present invention.

FIG. 26 is a flowchart illustrating the operation of FIG. 25 of processing image data in accordance with one embodiment of the present invention.

FIG. 30 is a flowchart illustrating the operation of FIG. 26 for constructing the color palette in accordance with one embodiment of the present invention.

FIG. 31 is a flowchart illustrating the operation of FIG. 25 for processing non-image data in accordance with one embodiment of the present invention.

DETAILED DESCRIPTION OF SPECIFIC EMBODIMENTS

Figure 1:
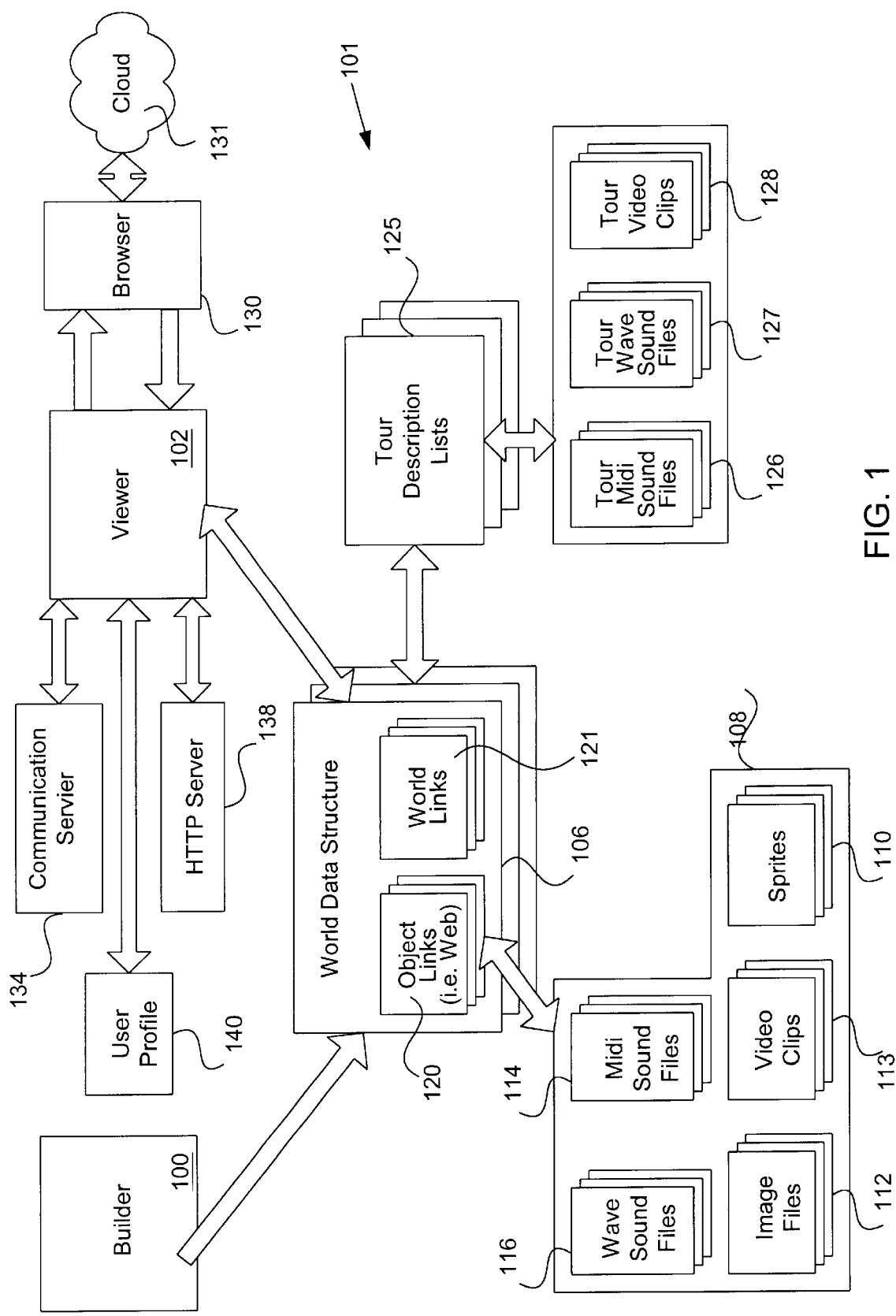
FIG. 1 is a diagrammatic representation of a system for building and displaying 3D worlds in accordance with one embodiment of the present invention.

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In general terms, the present invention provides mechanisms and techniques for generating and displaying three dimensional (3D) representations or worlds. A 3D world is a virtual reality type environment that includes a plurality of 3D objects that are displayed or executed within the 3D world. The present invention allows a user to build 3D worlds and/or display 3D worlds and navigate through such displayed 3D worlds.

A builder graphical user interface is provided that allows a user to populate a construction site with objects or links that may be displayed as an associated 3D world. For example, one or more objects and/or links may be placed at one or more particular locations within the construction site. The construction site and associated objects and/or links may then be compiled and organized within a data structure that is then used to generate a 3D world. The data structure is organized such that specific locations within the construction site and associated objects and/or links correspond to specific locations within the 3D world.

The objects and/or links may take a wide variety of forms, such as image files for forming 3D objects, sound files, executable objects, video clips, links to other 3D worlds or to other objects (e.g., URL addresses to web sites), etc. Three dimensional objects may be displayed within the 3D worlds as part of the virtual reality environment. For example, a 3D object may be in the form of a building that a user may navigate around and view from various angles. A sound objects may be associated with particular locations within a 3D world and played when a user moves over such particular locations, for example. Likewise, links to 3D worlds or to other objects, such as web pages, may be associated with particular locations and 3D objects within a 3D world. The referenced objects may be executed when a user moves over the particular locations or bumps into the associated 3D objects, for example.

By layering the objects and links together on a particular location, a rich realistic 3D environment may be provided. Additionally, when executable objects and/or links are associated with 3D objects, the resulting 3D world provides a visually appealing and logical mechanism for displaying and organizing links and objects. For example, a web page for a music commerce site may be associated with a meaningful 3D object, such as a 3D music store.

Architecture Embodiments for Generating and Displaying 3D Worlds

FIG. 1 is a diagrammatic representation of a system 101 for building and displaying 3D worlds in accordance with one embodiment of the present invention. As shown, the system 101 includes a builder 100 for generating a data structure 106 for a particular 3D world and a viewer 102 for displaying the 3D world based at least, in part, on the generated data structure 106.

The generated data structure 106 includes references to a plurality of assets 108. These assets 108 may include any suitable data objects and/or links that may be viewed, played, or executed within an audio visual environment. Of course, the assets 108 may include merely image files, audio objects, video objects, executable objects, or any combination thereof. In one embodiment and as shown, the assets 108 include image files 112, video clips 113, wave type sound files 116, MIDI sound files 114 and sprite files 110. Wave type sound files refer to a digitized sound file, while MIDI refers to a file that is used to synthesize sounds through the use of sound descriptions.

The generated data structure 106 may also include links to objects. As shown, the data structure 106 may include object links 120 (e.g., web links) and other world links 121. The generated data structure 106 may reference objects that are located outside of the data structure 106 or within the data structure 106.

When a 3D world is displayed based on the generated data structure and associated links and objects, the links and objects are transformed into interactive objects within the 3D world. For example, image files may be converted into 3D objects that are displayed within the 3D world. The user may navigate around such 3D objects. Additionally, the 3D objects within the 3D world may be associated with executable objects or links that reference executable objects. For instance, a web page may be loaded when a user navigates near or into a 3D object that is associated with a web link.

The object links 120 may take any suitable forms that are executable by a computer system. For example, the object links 120 may include a link to an executable file or a link to an input to a particular application (e.g., URL sites or spread sheet documents). The data structure 106 may also reference other data structures 121 for other 3D worlds. Thus, several 3D worlds may be linked together to form complex superstructures.

Image files referenced by the data structure 106 may be used to generated 3D objects within the associated 3D world. That is, the images may be used by the viewer 102 to render portions of the 3D world. For example, floor images may be used to render a floor and/or other type of ground covering within a mall; ceiling images may be used to render the ceiling of such mall; and wall images may then be used to render various vertical structures within the mall. For example, the wall images may include doors to various shops within the mall, columns, windows, an exit that includes a view to other buildings outside of the mall, or a stairway within the mall. Several specific examples are illustrated below in reference to FIGS. 6 through 19.

The image files may be configured in any suitable form for rendering 3D objects. For example, the image files 112 are in the form of two-dimensional (2D) images that are used to render 3D objects within the associated 3D world. In one embodiment, the image files include 2D images for generating building, walls, floors, and ceilings. The image files may be in any suitable image format for representing images. For example, the image files may be in the form of bitmap or JPEG image files. Although the images are described as being resident in a plurality of files, of course, the images may be integrated within a single file or within any other type of computer readable object or objects.

The data structure may be configured to reference any type of sound objects for adding sound to a displayed 3D world. One or more sound object may be played within the 3D world. For example, several sound objects may be blended together or a single sound object may be played at a particular location within the 3D world. In one embodiment, the data structure 106 references wave type sound files 116 and MIDI type sound files 114. The sound objects may be formatted within one or more files or any other type of computer readable object or objects. Alternatively, sound objects may be streamed live from another source, such as a microphone or a video camera.

The data structure may also be configured to reference one or more sprite objects. Sprites may be in the form of objects capable of approximating 3D objects within the 3D world. A sprite contains references to 2D images that are stitched together to simulate a 3D object. For example, photographs are taken of a real-life 3D object at various angles. A photo of a house may be taken from the front, the left side, the right side, and the back side of the house. These photographs are then stitched together to form a 3D object that is viewable within the 3D world from various angles. Photographs of a real-life 3D object may be generated for any suitable number of angles, depending on the desired level of accuracy and realism of the resulting simulated 3D object. For example, a person may have to be photographed from several angles to effectively simulate the person in three dimensions.

Alternatively, a sprite object may be in the form of a 3D object that appears to rotate when viewed from a single location within the 3D world. In one embodiment, 2D images may be sequentially displayed from a single angle to give a "rotating" effect. Of course, the 2D images may be sequentially played at varying angles such that the 3D object appears to rotate when viewed from any angle. Another sprite object may be in the form of a animated sprite object that is displayed on another 3D object such as a wall object. For example, the animated sprite object may be an advertisement billboard that displays a video clip.

The data structure 106 may also reference tour description lists 125. The tour description lists 125 are used to define specific routes in the 3D world that the user may select automatically. For example, a user may choose a route that takes the user from shop to shop within a mall. Various events may occur while the user automatically travels along the predefined route. By way of example, various sounds may be initiated and/or video clips may be executed at various points along the predefined route, and these sounds and/or video clips may be terminated at other points along the route. Thus, the tour description list 125 may reference tour MIDI sound files 126 tour wave sound files 127, and/or tour video clips 128.

The viewer 102 is configured to display a 3D world associated with the data structure that is generated from a populated construction site. Objects and links associated with the data structure are displayed and/or executed within the 3D world. For example, a web link may be selected and loaded within the 3D world.

In one embodiment, the data structure may include web links, and the viewer 102 communicates with a web browser 130 using an inter-process communication protocol, such as Component Object Model (COM). The viewer 102 may be configured to control any suitable browser, such as the Microsoft Internet Explorer. The browser is coupled to an internet cloud 131. Viewer 102 may also interface with an HTTP server 138 that may be used to store web pages or other world data structures, for example. Alternatively, the viewer 102 may be configured to communicate with any other type of network.

The viewer 102 may also interact with a communication server 104 that provides information about various objects within a currently active 3D world. For example, the communication server may display the user's positions within a currently active 3D world. The viewer 102 may also have access to a user profile 140 that stores various user specific characteristics. For example, the user profile 140 may include selectable preferences for how the 3D worlds are displayed.

The data structure 106 and associated information may then be used to generate a 3D world based on the information. The data structure 106 and associated information are associated with a construction site that is populated with specific objects and links. In general terms, the data structure 106 includes references to objects (e.g. assets 108) and/or links (e.g. object links 120 or world links 121). These objects and/or links are associated with various locations of the construction site that correspond to locations within the associated 3D world. Thus, a 3D world may be efficiently generated from the data structure based on specific locations of the construction site and associated objects and links.

Data Structure Embodiments

As described above, a data structure is generated from a populated construction site. The populated constructions site includes a discrete set of sections or "tiles". In one embodiment, the construction site is a 16 by 16 array of tiles. Each of the tiles may be populated with one or more objects or links (hereinafter, referred to collectively as attribute instances). Additionally, one or more tiles may be subdivided into a plurality of positions and have attribute instances associated with any number of these positions. In general terms, the data structure is configured to associate each tile of the construction site with data for one or more attribute instances that are placed on the particular tile during population of the construction site.

Figure 2:
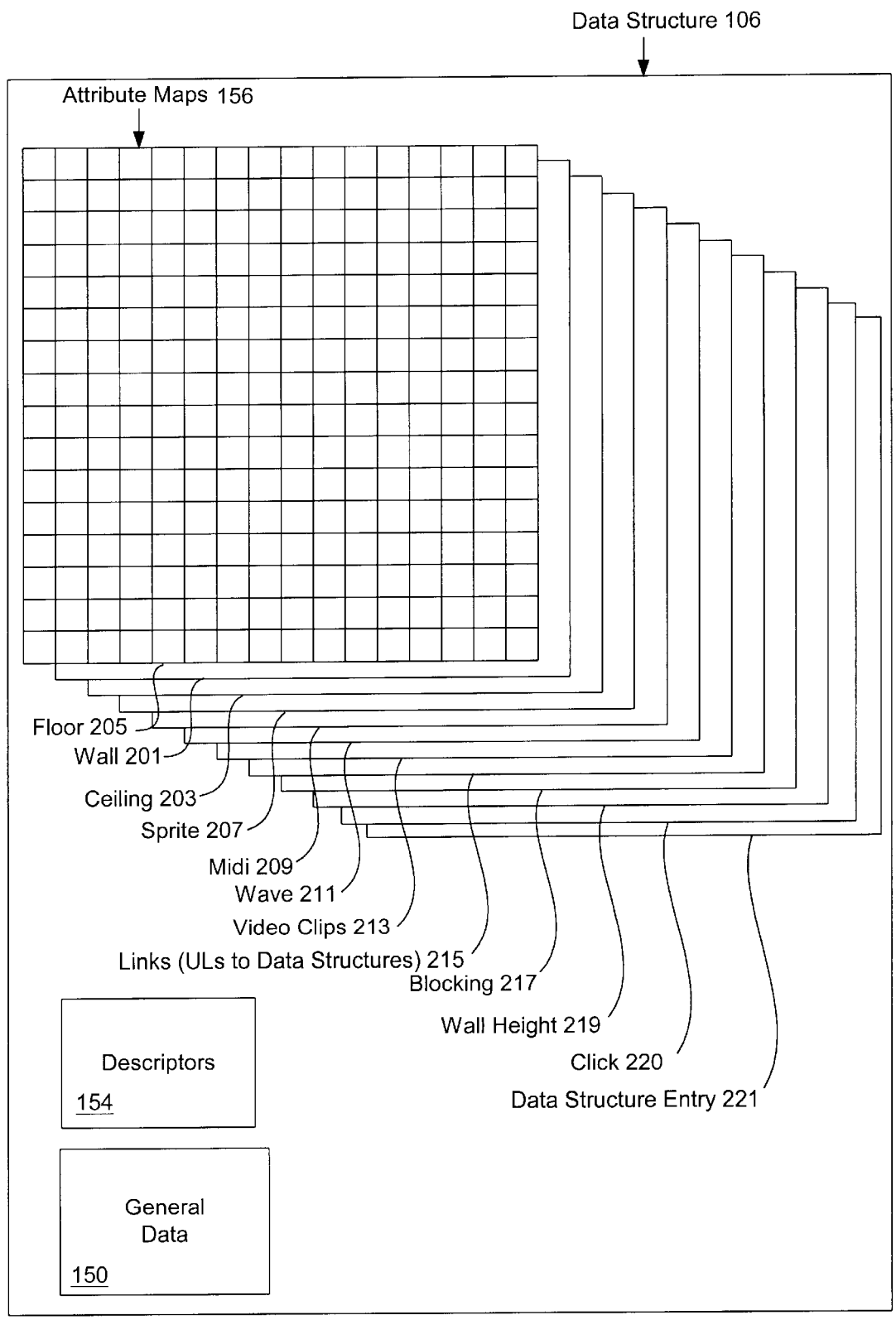
FIG. 2 is a diagrammatic representation of the data structure of FIG. 1 that may be used by the viewer to display a corresponding three dimensional world in accordance with one embodiment of the present invention.

FIG. 2 is a diagrammatic representation of the data structure 106 of FIG. 1 that may be used by the viewer 102 to display a corresponding 3D world in accordance with one embodiment of the present invention. The data structure 106 includes a plurality of attribute maps or layers 156, a plurality of descriptors 154, and a general data portion 150.

Each attribute map is divided into a discrete set of locations or tiles, and the number of tiles corresponds to the number of tiles on the construction site. Each attribute map is also associated with a particular type or group of attribute instances. As shown, there is a attribute map for floor objects (205), wall objects (201), ceiling objects (203), sprite objects (207), MIDI sound objects (209), wave sound objects (211), video clip objects (213), links (215), blocking objects (217), wall height objects (219), click objects (220), and data structure entries (221).

As shown, the attribute layers are conceptually layered over the construction site such that more than one attribute instance from different attribute layers may associated with a single location on the construction site. For example, the floor attribute layer 205 may associate a floor attribute instance with a particular tile, and the ceiling attribute map 203 may associate a ceiling attribute instance with the same tile.

Each attribute map is formatted such that a specific tile within the populated construction site is associated with specific identifiers. The identifiers correspond to the attribute instances that are used to populate the specific tiles. In one embodiment, the identifiers are in the form of numbers. For example, if five types of floor coverings (e.g., floor image objects) are used to populate the construction site, the floor attribute map 205 will contain five different identifier numbers. That is, any tile that contains a first type of floor covering will have a first identifier number (e.g., "1"), any tile that contains a second type of floor covering will have a second identifier number (e.g., "2"), etc. When a particular floor covering may cover several tiles of the construction site, the floor attribute map 205 will contain a plurality of "1" identifiers. That is, each tile that has the first type of floor covering will have a "1" identifier at the corresponding location in the floor attribute map.

The descriptors 154 are formatted such that the identifiers are associated with specific attribute instances. In one embodiment, a descriptor will only contain identifiers for the attributes that were used to populate the associated attribute map. In the above example, since the floor attribute map 205 contains five types of identifiers (five types of floor coverings were used to populate the construction site), the floor descriptor will have five different attribute instances that are associated with the five identifiers. In general, the descriptor may either contain or point to the data that constitutes its associated attribute instances.

The general data portion 150 defines various characteristics of the 3D world that are not associated with a particular location within the 3D world. For example, the general data portion may describe how far a ceiling is from a floor within the 3D world. Several examples of the general data are described below in reference to FIG. 4.

Figure 3:
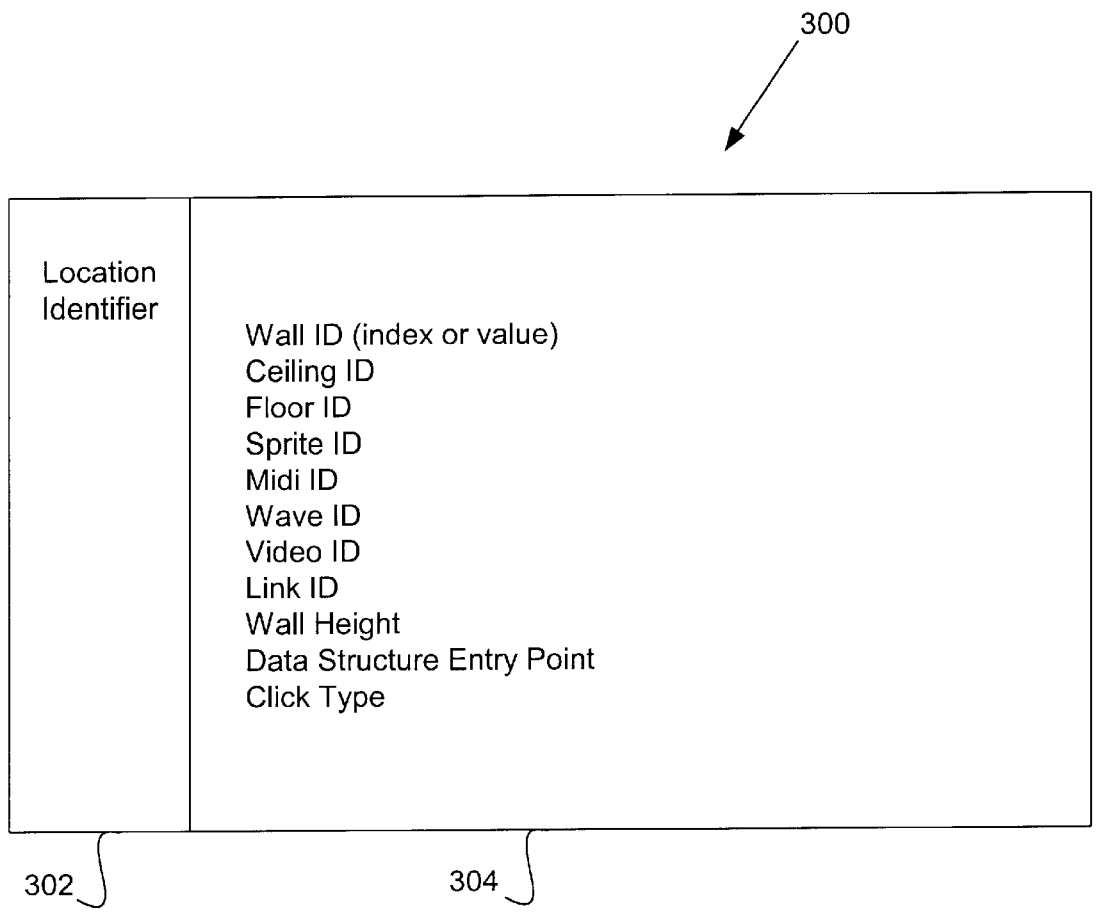
FIG. 3 is a diagrammatic representation of a particular location in the construction site and the location's associated identifiers and attribute instances in accordance with one embodiment of the present invention.

FIG. 3 is a diagrammatic representation of a particular location in the construction site and the location's associated identifiers and attribute instances in accordance with one embodiment of the present invention. As shown, the particular location is indicated by a location identifier 302. By way of example, if the construction site is a 16 by 16 grid, the location identifier 302 may be in the form of [1,1], which location identifier corresponds to the top left corner of the 16 by 16 grid. In contrast, the location identifier [16,16] corresponds to the bottom right corner of the 16 by 16 grid.

As shown, the particular location identifier 302 is associated with a plurality of attribute instance identifiers 304 from different attribute layers. Consequently, several attribute instances may be associated with a particular location of the construction site. Said in another way, a plurality of identifiers from a plurality of attribute layers (e.g., 156 of FIG. 2) may be associated with a particular location of a construction site. In the embodiment shown, the identifiers 304 include a wall identifier, a ceiling identifier, a floor identifier, a sprite identifier, a MIDI identifier, a wave identifier, a video identifier, and a link identifier.

The identifiers may be in any suitable form for referencing objects or links. In one embodiment, the identifiers are in the form of numbers that are each associated with a specific object or link within an associated descriptor. By way of specific example, if there are sixteen wall images within the associated descriptor, numbers 1 through 16 are used to identify the 16 different wall images. A wall identifier equal to the number 2 then corresponds to the second wall image within the associated descriptor.

Identifiers may also be in the form of a predefined value. For example, a user may set particular identifier values that correspond to particular features of the resulting 3D world. By way of specific example, a wall height value may be selected, which value may correspond to an apparent height of a wall positioned on a particular location in the 3D world. Thus, for a particular location a wall image will have a particular height value that is defined by the associated identifier. Any number of height values may be selectable. For example, a value between 0 and 255 may be used to select 256 different wall heights.

If the particular location 302 and associated identifier in a first 3D world has an associated link to a second 3D world, the particular location identifier may also have a corresponding entry point value within the second 3D world. That is, if the particular location in the first construction site is linked to a second populated construction site, an entry point may be defined on the second construction site. Thus, when one jumps from the first construction site to the second construction site, they enter the second construction site at a location that is defined by the entry point value.

The particular location identifier 302 may also be associated with a click type value that indicates how an associated executable object or link is handled when a user moves over the corresponding location or clicks on the corresponding location with an input device (e.g., a mouse or keyboard) within the 3D world. By way of example, a first click type value may indicate that a link is only executed when the user moves over the particular location. In contrast, a second click type value may indicate that the link may also be executed when the user clicks on the corresponding location with the input device in the 3D world.

Figure 4:
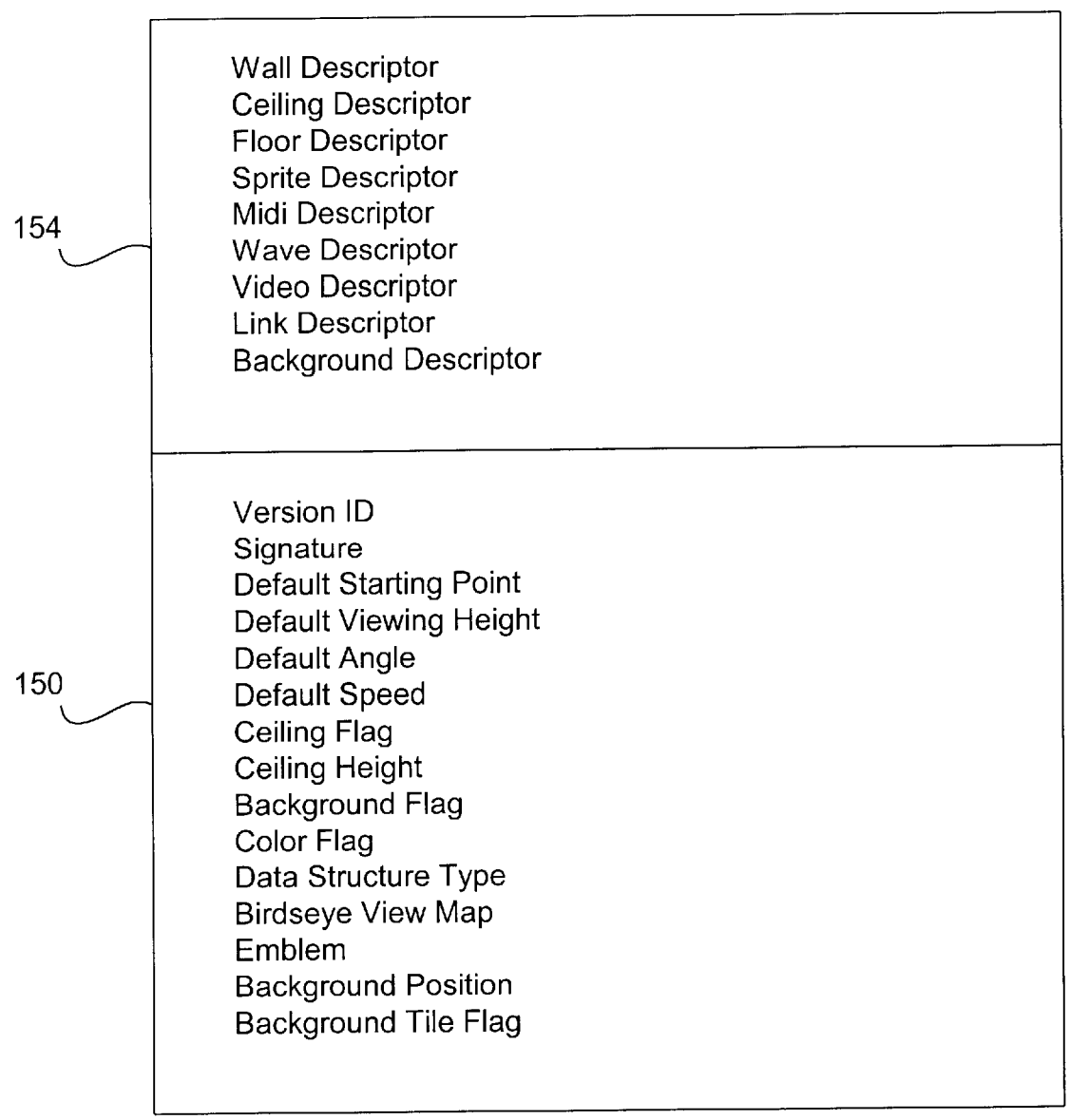
FIG. 4 is a diagrammatic representation of the descriptors and the general data portion of the data structure of FIG. 2 in accordance with one embodiment of the present invention.

FIG. 4 is a diagrammatic representation of the descriptors 154 and the general data portion 150 of the data structure of FIG. 2 in accordance with one embodiment of the present invention. As shown, the descriptors 154 include a wall descriptor, a ceiling descriptor, a floor descriptor, a sprite descriptor, a MIDI descriptor, a wave descriptor, a video clip descriptor, a link descriptor, and a background descriptor.

The descriptors may reference attribute instances in any suitable manner. For example, as described above the descriptors may match identifiers within the attribute layer to specific attribute instance data. In one embodiment, an identifier may be matched to a starting address in a bitmap file that may include all of the images for a certain type of attribute instance. The particular bitmap file may include any number of images that may be used as data for different attribute instances. For instance, a wall bitmap file may include 16 different wall images, and numbers 1 through 16 are used as identifiers that reference the different wall images.

The descriptor may be formatted to match identifiers of the associated attribute layer to specific starting addresses of particular images within the wall bit map file, for example. If the image size is known, the descriptor may merely include the starting address of the particular image within the bitmap file. If the image size is not known, the descriptor may include the end address, as well as the starting address, of the particular image within the bitmap file.

The general data portion 150 of the data structure 106 includes various information that is used to generate and display the 3D world. For example, a default starting point within the 3D world may be included. When the 3D world is displayed in the viewer 102, the user will start at the default starting point if another starting point has not been defined. The starting point corresponds to a particular location in the construction site, as well as the 3D world.

Likewise, a default viewing height may be included within the general data portion 150. When the 3D world is generated and displayed, the user's perspective seems to be from a particular viewing height with respect to the 3D world. For example, if the 3D world is in the form of a mall interior, a viewing height value may be set to a height that approximates head level so that the view appears "normal" to the user (e.g., the user appears to be viewing the 3D world from head level). Alternatively, the user height may be set at a relatively high value and the user may appear to float through the air, high above the floor of the mall.

Any number and type of user perspective values may be defined and/or set to default values within the generated data structure. These default user perspective values may then be changed prior to generating the data structure and/or after the 3D world is displayed. By way of example, a default angle may be defined in the general data portion 150. The default angle is defined as the direction the user appears to be looking within the 3D world. For example. a north, south, west, or east direction may be defined as the default angle. If the default angle is defined as the south direction, the user will appear to be looking towards the southern end of the 3D world. That is, even when the user is moving in another direction (e.g., in the northern direction), the user continues to look in the southern direction.

A default speed may also be set that defines how fast the user appears to be traveling within the 3D world. As shown, the general data portion 150 also includes a ceiling flag and a ceiling height value. In this embodiment, the ceiling flag is used to indicate whether a ceiling attribute instance is present in the construction site. If a ceiling attribute instance is present, the ceiling height value is used to define how high the ceiling appears in the viewer 102.

The general data portion 150 may also include a background flag and a color flag. The background flag is used to indicate whether the background descriptor references one or more predefined images that are used to generate the background of the 3D world. That is, the space behind the generated 3D objects in the 3D world may include a particular background image, such as a "cloudy" sky image. The color flag is used to indicate whether the background descriptor references a particular color that is defined in an image file or defined by a particular color RGB value, for example.

The general data portion 150 may also include a reference to a birdseye view map or 2D representation. The birdseye view is a 2D representation of the 3D world that may be generated and displayed along with the 3D world. An emblem image may also be referenced in the general data 150. The emblem image indicates to which group the particular 3D world and associated data belongs. A background position value may also be defined that indicates the background image's location with respect to the ceiling and floor. A background file flag may also be defined to indicate whether the background includes a plurality of duplicated images.

After a particular construction site has been populated with attribute instances and general data has been defined and compiled into an associated data structure, a 3D world based on the data structure 106 may then be generated and displayed within the viewer 102. Several embodiments of the viewer are described in concurrently filed, co-pending U.S. Patent Application, having application Ser. No. 09/183642, which is herein incorporated by reference in its entirety.

Various objects within the 3D world correspond to attribute instances that were associated with the construction site and compiled within the associated data structure 106. For example, attribute instances that may be used to represent the inside of a mall may be associated with the data structure 106, and thus, a 3D mall interior with associated 3D structures may be generated and displayed within the viewer 102.

Viewer Embodiments for Displaying 3D Worlds

Figure 5:
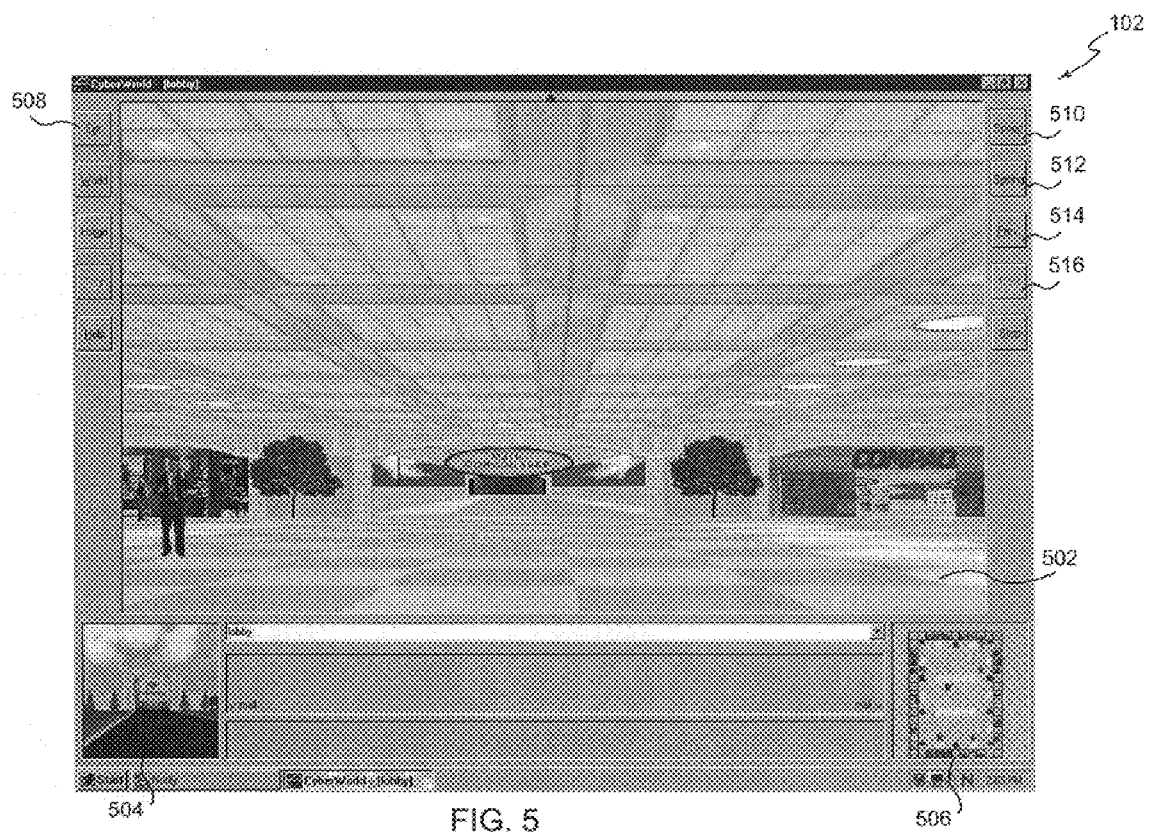
FIG. 5 is a screen shot of a viewable portion of a three dimensional world that has been generated and displayed in the viewer in accordance with one embodiment of the present invention.

FIG. 5 is a screen shot of a viewable portion of a 3D world that has been generated and displayed in the viewer 102 in accordance with one embodiment of the present invention. As shown, the viewer 102 includes a 3D world within a 3D viewport 502, a 2D representation from a birdseye perspective of the data structure 106 in a 2D viewport 506, and an emblem image 504 that is used to group a plurality of worlds.

User preferences for how the 3D world is displayed and navigated through may be configurable using any suitable mechanisms. As shown, a speed button 510 is provided such that a user may switch between a plurality of different navigation speeds. This mechanism is similar to a gear shift in a car, for example. Of course, other types of mechanisms may be provided for changing speeds, such as a value entry window that allows entry of a specific speed value.

Another button provides access to a plurality of definable settings 512 for controlling how the 3D world is displayed and navigated through. For example, an apparent height of the 3D world may be set via the setting 512. Several examples are described in concurrently filed, co-pending U.S. Patent Application, having application Ser. No. 09/183, 642, which is herein incorporated by reference in its entirety.

As described above, particular locations within the 3D world may be linked to other worlds or executable objects, such as URL sites or video clips. As a user travels between these different links and objects, mechanisms may be provided for jumping back to previously traveled links or forward again to previously traveled links. For example, a user may travel from a first world to a second world to a third world. The user may then wish to travel back to the second world. Thus, a previous button 514 may be selected, and the user jumps back to the second world. The user may then wish to travel forward again (e.g. to the third world), and this may be accomplished by utilizing a next button 516. When a link is loaded by a web browser and the user travels from the first link to other links via the web browser, the user may wish to jump all the way back to the 3D world that was displayed before the first link was loaded and displayed. Thus, an exit button 508 is provided to allow the user to travel all the way back to the 3D world from which the link was loaded.

Various mechanisms for providing the above described features within the viewer 102 may be implemented. Additionally, several different mechanisms for the same particular feature may be implemented within the same display mechanism. For example, in addition to providing buttons for the user to navigate within the 3D world, access to pull down menus may also be provided with the click of a right mouse button or other similar mechanism.

Builder Graphical User Interface Embodiments for Generating 3D Worlds

Turning back to the builder side 100, the data structure 106 used by the viewer 102 to display an associated 3D world may be generated by the builder 100. The data structure is compiled from an associated construction site that is populated and/or associated with a plurality of objects and/or links. In one embodiment, the builder 100 provides a graphical user interface 600 for populating and/or editing construction sites. In sum, each 3D world that is displayed within the viewer 102 is based on a populated construction site that was generated within a builder 100.

Figure 6:
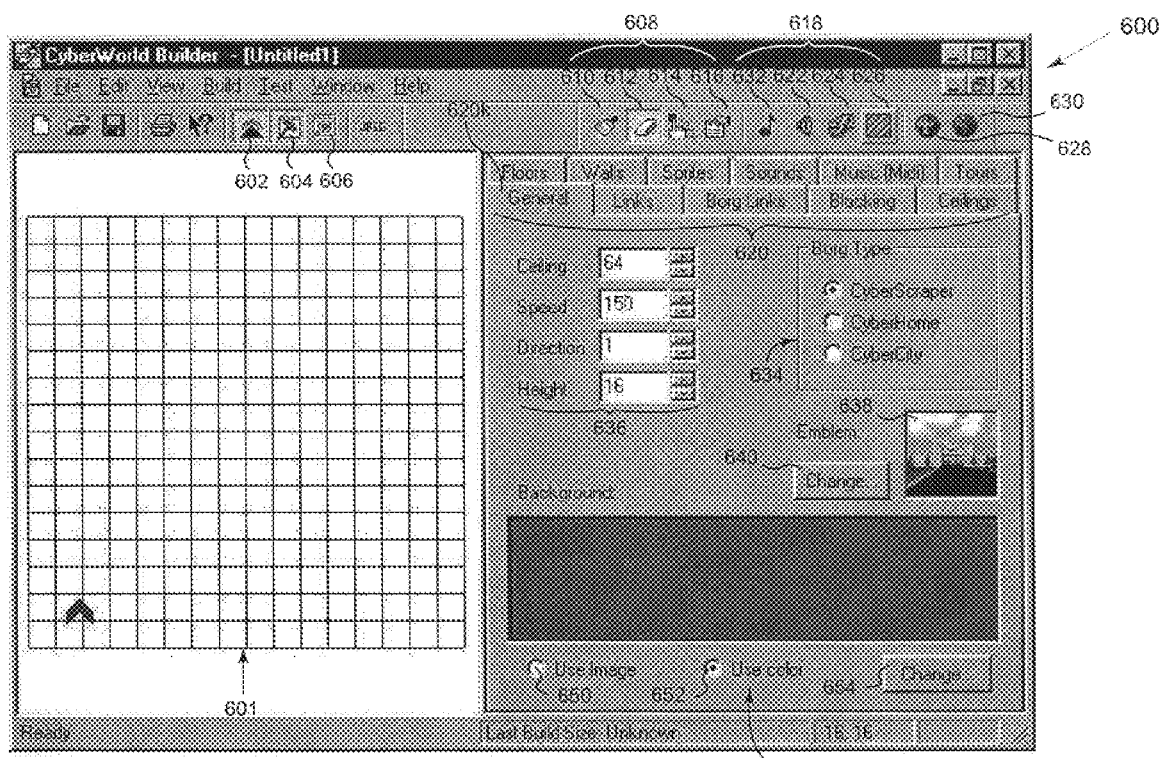
FIG. 6 is a screen shot of the builder of FIG. 1 having a graphical user interface for populating a particular construction site and generating a three dimensional world based on the populated construction site in accordance with one embodiment of the present invention.

FIG. 6 is a screen shot of the builder 100 of FIG. 1 having a graphical user interface 600 for populating a particular construction site 601 and generating a 3D world based on the populated construction site 601 in accordance with one embodiment of the present invention. The same graphical user interface (GUI) 600 may also be used to modify an existing construction site. As shown, an unpopulated construction site 601 is displayed within the builder's GUI 600.

The GUI 600 may also include any suitable mechanisms for selecting how the GUI is presented to the user as they populate the construction site. For example, as the user populates the construction site 601 with various objects and/or links, a separate display window (not shown) may include the resulting 3D world. As shown, the GUI 600 includes a "remote" button 602 that allows the user to select between displaying and updating the resulting 3D world as the construction site is modified or not displaying the 3D world until a later time (e.g., after the populated construction site 610 is compiled).

This remote button 602 feature renders the 3D world "on the fly" while the construction site is being modified and allows the user to quickly assess the results of their work within the construction site 601. In one embodiment, a 3D world is updated when existing attribute instances are modified in the construction site and not when attribute instances are added to the construction site. In this case, a 3D world may be generated during compilation. Alternatively, the 3D may be updated when the associated construction site is altered in any way (e.g., when attribute instances are added).

The GUI 600 may also include an "enlarge" button 604 that selectably displays and hides a tool palette area 642 that allows selection of attributes for the construction site 601. When the tool palette 642 is hidden, the construction site 601 is enlarged to fill the tool palette area 642 so that the user may more closely assess which objects and links have already been placed within the construction site 601. Similarly, a "zoom" button 606 is provided to allow the user to more closely inspect an object or link before placing it within the construction site 601. For example, after the "zoom" button 606 and a particular attribute instance are selected, an enlarged thumbnail image of the attribute instance is then displayed.

The GUI 600 may also include any suitable editing mechanisms for populating and modifying the construction site 601. As shown, the GUI 600 includes a plurality of tools 608: a paint tool 610, an erase tool 612, an edit tool 614, and an attribute modification tool 616. When the paint tool 610 is selected, the user may select objects and links and place them on the construction unit 601. In one embodiment, attribute instances (e.g. objects and links) may be placed onto the construction site 601 using a "painting" motion with the input device, e.g., a mouse. Of course, the attribute instances may be placed on the construction site in any suitable manner. For example, the attribute instances may be placed on the construction site one at a time. That is, a single attribute instance is placed within a single location within the construction site 601.

Although the present invention is described as including the above described tools, of course, this list is merely illustrative and not meant to restrict the scope of the invention. For example, the builder 100 may include a subset of the above described tools, additional tools, or any combination thereof. By way of specific example, the builder 100 may include a selection tool for allowing selection of a particular texture from a tile on the populated construction site 601. The selected texture may be applied onto other tiles of the construction site.

When the erase tool 612 is selected, attribute instances may be selected and erased from the construction site 601. When the edit tool 614 is selected, attribute instances within the construction site may be rearranged. For example, an attribute instance may be moved or copied from a first location to a second location within the construction site 601. When the attribute modification tool 615 is selected, the associated characteristics of a selected attribute instance may be modified for a particular tile within the construction site. For example, a height value for a particular object as represented within the 3D world may be selected and modified. Alternatively, an attribute instance may be modified globally for all existing 3D worlds and/or for all 3D worlds that are created after any modification.

As attribute instances are added to the construction site 601, the attribute instances are displayed within the construction site 601. Several different attribute instances may be layered on top of one another within the construction site 601. As attribute instances are layered, it may be hard to distinguish between the different attribute instances in the construction site 601. Thus, the GUI 600 may provide a mechanism for displaying and hiding particular types of attribute instances.

As shown, the GUI 600 provides a plurality of display buttons 618 for displaying or hiding a particular attribute layer. As shown, the display buttons 618 include a wave type sound button 632, a MIDI type sound button 622, a link button 624, and a blocking button 626. These types of attribute instances are further described below. Alternatively, a display button may be included for each attribute layer.

Mechanisms may be provided within the GUI 600 for organizing the completed construction site 601. In other words, the completed construction site may be associated with other construction sites. As a result, a 3D world that is generated from the populated data structure will be associated with other 3D worlds. Any suitable mechanism may be used for organizing the completed construction site and associated 3D world. As previously described, links may be placed within a construction site, and those links may be selected and loaded within the associated 3D world. Additionally, the populated construction site and corresponding 3D world may be associated with a hierarchical list of 3D worlds.

In one embodiment, when the construction site 601 is completed, it may be added to the hierarchical list of worlds. As shown, an "add to world list" button 628 is provided within the GUI 600 to select a parent construction site (and associated world). By way of example, if the completed construction site is in the form of a mall, a previously existing construction site that is in the form of a particular city (e.g. Toronto) may be selected as the parent of the mall construction site. As shown, a "world" button 630 is also provided so the user may view the hierarchical list.

In general terms, the GUI is configured such that the user may easily populate the construction site 601 with a plurality of attribute instances selected from an organized plurality of available attribute instances. The available attribute instances may be organized in any suitable manner such that the users may efficiently select the attribute instances and populate the construction site 601.

The attribute instances (not shown) are grouped and displayed on separate palettes that are selectable by an associated tab 620. Each palette of attribute instances may form part of a conceptually separate attribute layer or map that may be placed on the construction site 601. For example, the attribute instances may be grouped according to their position within the resulting 3D world, such as part of a floor, wall, or ceiling palette. The attribute instances may also be grouped according to type, such as object links. As shown, the attribute instances are grouped into the following attribute layers: floors, walls, sprites, wave formatted sounds, MIDI formatted sounds, tours, (object) links, borg (other data structure) links, blocking, and ceilings.

Although the attributes (e.g., attribute instances and other user selectable information) are described as being grouped into separate tabs 620, of course, the attributes may be grouped in any suitable manner. For example, a single type of attribute may be grouped and spread among several different tabs 620. Additionally, a single tab may include more than one type of attribute.

The tabs 620 may also include additional user selectable information, in addition to attribute instances. As shown, the tabs 620 include a "general tab" 620k that may be selected to display a general input window within the tool palette area 642. The general input window allows selection of general characteristics of the 3D world that are not associated with particular locations within the construction site. Any suitable mechanisms for allowing modifications to general characteristics may be implemented. For example, a plurality of general values 636 may be entered into the general input window. For example, a ceiling value, a speed value, a direction value, and a height value may be selected by entering a value into the corresponding input boxes of the tool palette 642.

Other general features may be selected by selecting a corresponding button. For example, a 3D world type (e.g. borg type) 634 may be selected. The world type 634 categorizes the construction site and corresponding 3D world. As shown, a cyberscraper (an interior of a large building), a cyberhome (an interior of a small building), or a cypercity (an exterior view with buildings) are provided for selection. Different world types may have different associated default characteristics, such as world height. An emblem image 638 may also be selected within the general input window 642. The selected emblem defines which group the particular 3D world belongs to. In this embodiment, the emblem image is selected by selecting the "change" button 640.

Figure 7:
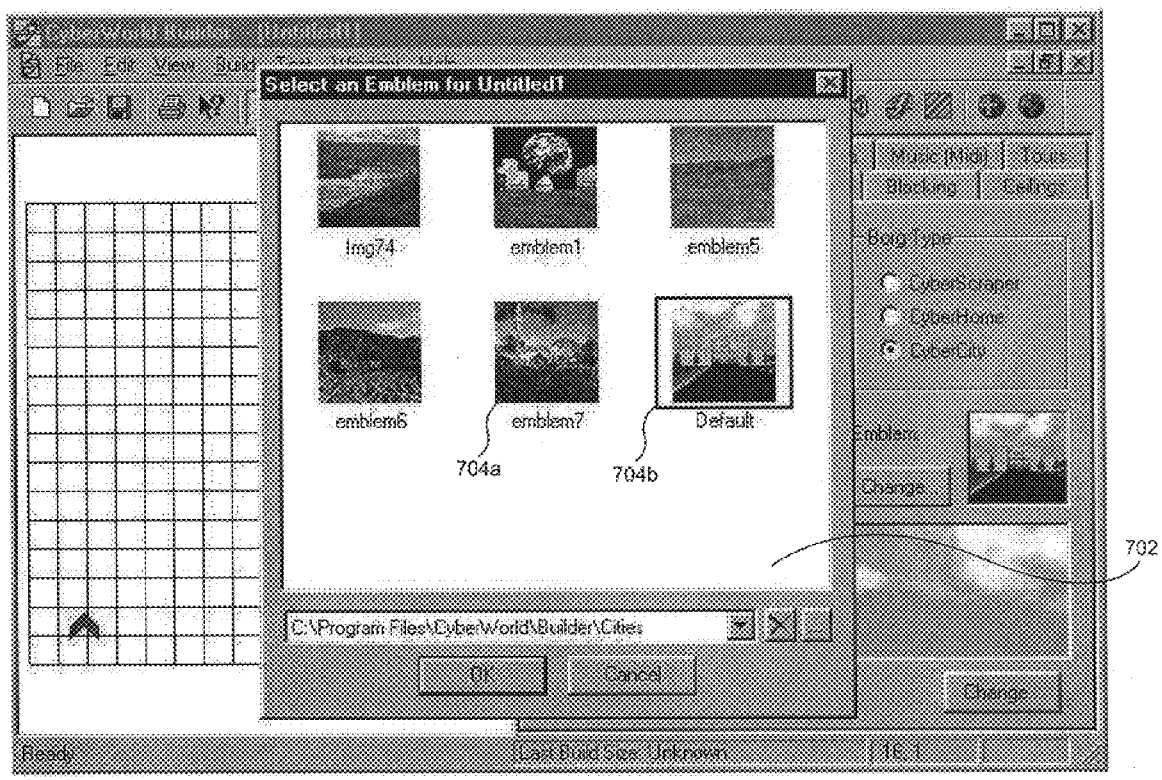
FIG. 7 is a screen shot of an emblem dialog box in accordance with one embodiment of the present invention.

Turning to FIG. 7, an emblem dialog box 702 is shown. The emblem dialog box 702 is displayed when a user selects the change button 640 of FIG. 6. The emblem dialog box 702 is in the form of a palette having a plurality of selectable emblem images 704. A particular emblem image 704a may be selected and used for a particular construction site. After the particular emblem 704a is selected, the construction site 601 and associated 3D world may belong to a same group as other construction sites and 3D worlds that are associated with the selected emblem image 704a.

Returning to FIG. 6, the general input window 642 may also provide a mechanism for selecting a background for displaying within the 3D world. Any suitable type of background may be used and displayed behind and around the displayed objects in the 3D world. As shown, the background may include an image, which is selected by an "image" button 650, or a solid color, which is selected by a "color" button 652. After either the image button 650 or the color button 652 is selected, the particular palette of images or colors may be displayed by pressing the change button 654. A particular image or color may then be selected from the displayed palette.

Besides providing selectable general characteristics, the builder 100 also provides mechanisms for populating the construction site 601 with selected attribute instances. Any suitable mechanisms may be provided for selecting a particular attribute instance and associating it with one or more locations of the construction site 601. In one embodiment, the attribute instances are painted onto the construction site 601. Painting may be initiated by selecting the paint tool 610, selecting a particular attribute instance tab 620, and selecting a particular attribute instance 804 from a palette that appears in response to the selection of the associated tab. One or more locations within the construction site 601 may then be selected for associating with the selected attribute instance, and the selected attribute instance is "painted" onto the construction site.

Figure 8A:
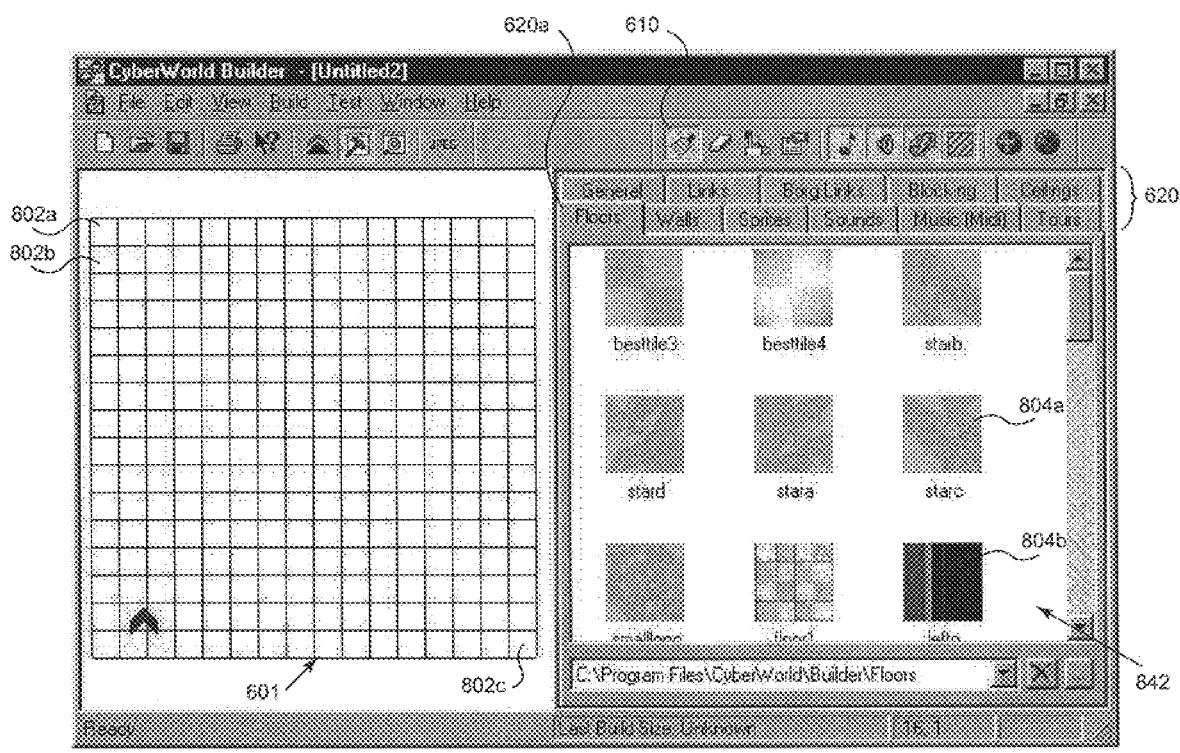
FIG. 8A is a screen shot illustrating selection of the floor tab of FIG. 6 in accordance with one embodiment of the present invention.

When a particular attribute instance tab is selected, a corresponding palette of attribute instances is displayed in the attribute display window 642. FIG. 8A is a screen shot illustrating selection of the floor tab 620a of FIG. 6 in accordance with one embodiment of the present invention. As shown, after the floor tab 620a is selected, a plurality of floor type attribute instances 804 are displayed within a floor palette 842. The floor type attribute instances may take a wide variety of forms that in general represent flooring, ground, ground cover and other surfaces. For example, the floor type attribute instances may represent carpeting, tiles, concrete, rock, grass, shrubbery, rivers, ponds, pits, etc.

Particular floor type attribute instances may then be selected from the floor palette 842 and associated with particular construction site location(s). For example, floor 804a or floor 804b may be selected and placed within the construction site 601. The selected attribute instance may be placed on one or more location within the construction site 601. That is, the construction site 601 is partitioned into a plurality of locations or sections 802, and each section or location may be configured to receive a single selected attribute instance of a particular type (e.g., attribute instance 804a from floor palette 842).

Figure 8B:
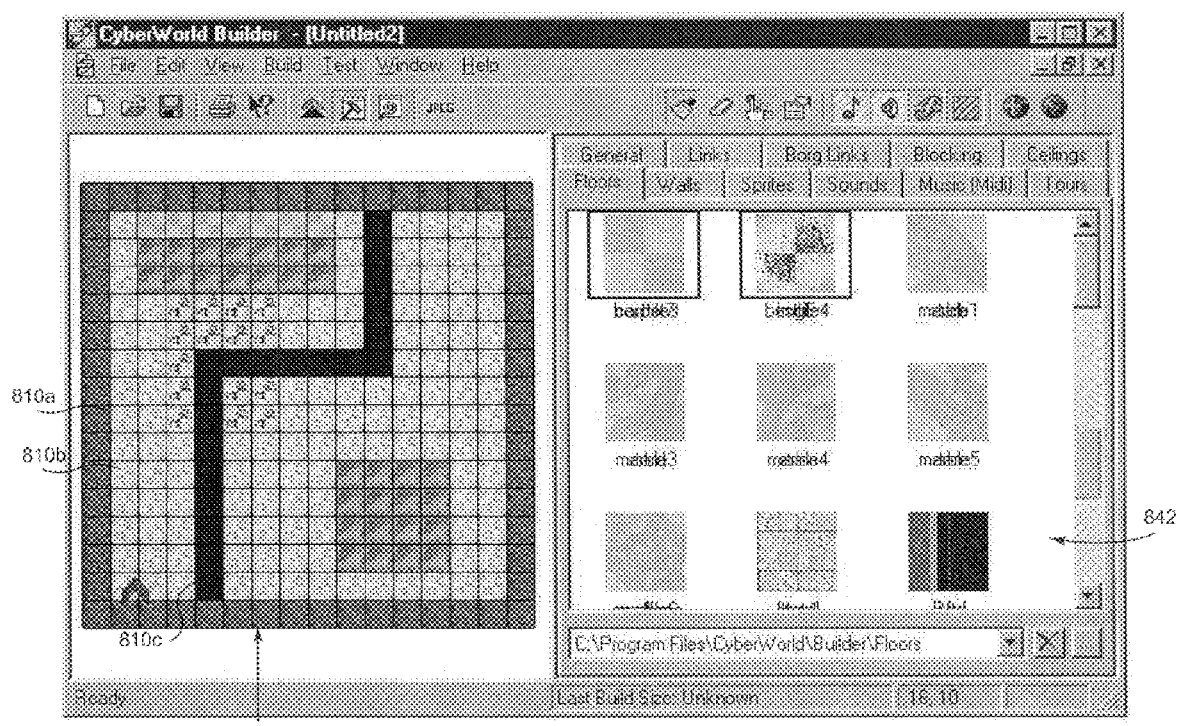
FIG. 8B is a screen shot illustrating the construction site of FIG. 8A after it has been populated with several different floor objects in accordance with one embodiment of the present invention.

FIG. 8B is a screen shot illustrating the construction site 601 of FIG. 8A after it has been populated with several different floor objects in accordance with one embodiment of the present invention. Various types of floor objects may be placed within the construction site 601 to create a desirable configuration of floor objects within the resulting 3D world. As shown, a ring of grass 810a is placed around a block of marble floor 810b, and a red carpet path 810c cuts across the block of marble floor 810b.

The attribute instance groups (e.g., palettes or attribute layers) are extensible. In one embodiment, new attribute instances may be associated with one or more of the attribute layers or palettes. For example, one or more new floor textures may be added to the existing floor palette 842. That is, floor image objects may be placed directly within the floor palette window 812. Several mechanisms for adding to an attribute layer or palette are described below in reference to FIGS. 34 and 35.

Figure 9A:
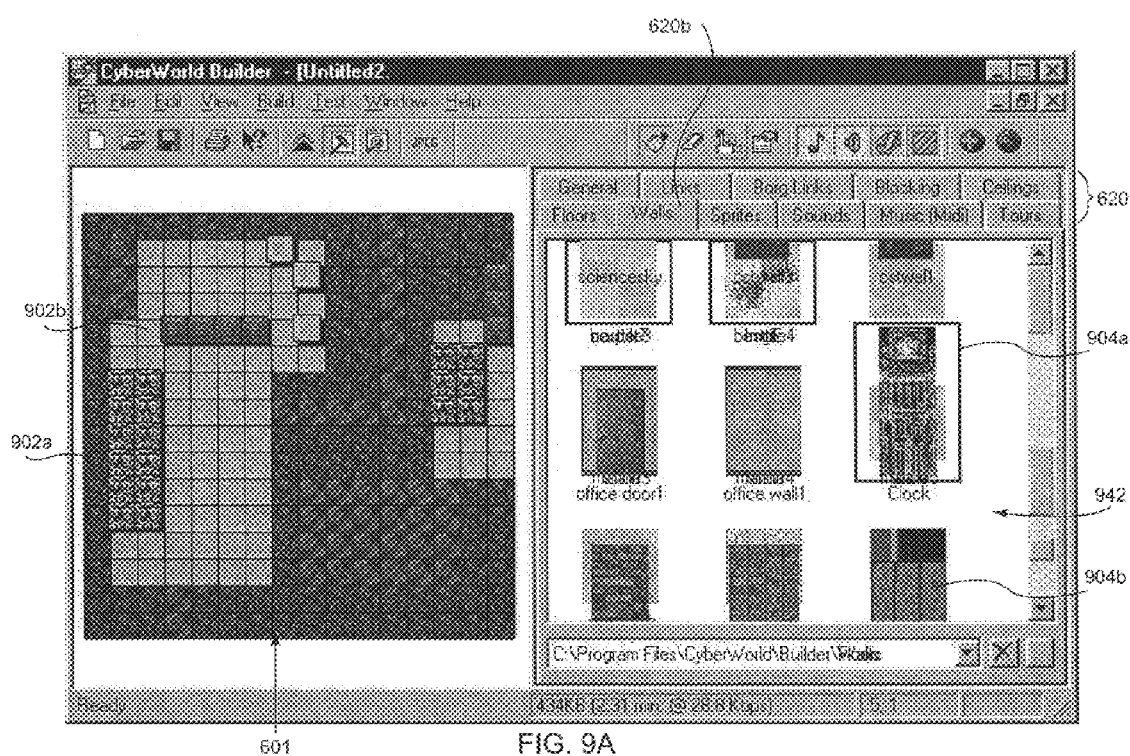
FIG. 9A is a screen shot illustrating the construction site of FIG. 8B after it has been populated with several different types of wall objects thereon in accordance with one embodiment of the present invention.

As described above, attribute instances may be layered on a particular location within the construction site 601. FIG. 9A is a screen shot illustrating the construction site 601 of FIG. 8B after it has been populated with several different types of wall objects in accordance with one embodiment of the present invention. To layer attribute instances, another palette or group of attribute instances may be selected from the tabs 620. As shown, a wall tab 620b is selected such that a palette of wall images 942 is displayed. The wall palette 942 includes a plurality of wall type attribute instances 904. The wall attribute instances 904 generally represent vertically oriented objects that may be displayed as 3D objects within the 3D world. In the context of a mall, the walls may take the form of interior and exterior building walls and/or room wall structures, doors to various shops within the mall, columns, windows, an exit that includes a view to other buildings outside of the mall, or a stairway within the mall. More generally, a wide variety of other vertical structures may be defined as wall images as well. By way of example, the wall attribute instances 904 may include a clock tower 904a, other buildings, trees, towers, poles, walls, fences, etc.

Attribute instances 904 may be selected from the palette 942 and associated with one or more locations within the construction site 601. As shown, the construction site 601 includes a first type of attribute instance 902a that is placed on a plurality of construction site location. The construction site 601 also includes a second type of attribute instance 902b that is also placed on a number of different locations within the construction site 601.

When these wall attribute instances 902a and 902b are used to generate the 3D world, wall images associated with the attribute instance are used to generate 3D objects within the 3D world. Any suitable mechanism may be used to generate a 3D object within the 3D world. For example, a single wall image may be used to generate each side of a particular building. That is, a single wall image is duplicated four times, for example, for each wall of a four sided building.

This method allows efficient generation of 3D objects from 2D images. In contrast to a virtual reality modeling language (VRML), which uses complicated algorithms to generate a 3D object, a 3D object may be generated by stitching 2D images together to simulate the 3D object. In other words, calculations for generating the shape of a 3D object are minimized.

Figure 9B:
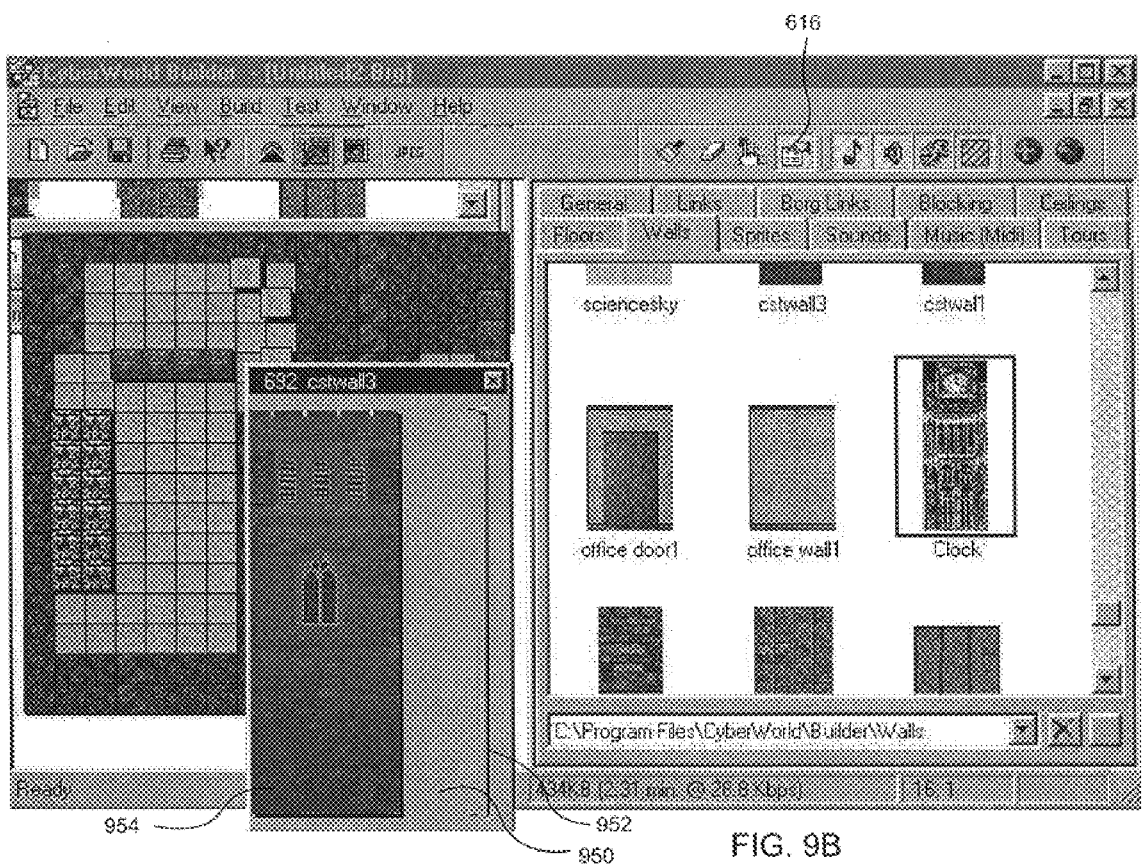
FIG. 9B is a screen shot showing a dialog box for modifying characteristics of a particular wall object of FIG. 9A in accordance with one embodiment of the present invention.

The GUI 600 may also include mechanisms for modifying a particular attribute instance's characteristics. For example, a wall height may be altered for a particular wall attribute instance. FIG. 9B is a screen shot showing a dialog box for modifying characteristics of a particular wall object of FIG. 9A in accordance with one embodiment of the present invention. The dialog box 950 is displayed after selecting the attribute modification tool 616 and then selecting a particular attribute instance to be modified from the construction site 601 or the palette display window 642. If the dialog box is accessed from the construction site, then the modification will only be applied locally to the selected attribute instances for the construction site. Alternatively, if the dialog box is accessed from the palette display window 642, the modification is applied globally to all subsequently created attribute instances. Alternatively, the modification may be applied to all existing, as well as subsequently created, attribute instances.

The dialog box 950 for modifying the selected attribute instance's characteristics may have any suitable form. As shown, the dialog box 950 includes a visual representation 954 of the particular attribute instance. The dialog box 950 includes a lever 952 that is slidably movable. A position of the lever 952 corresponds to a particular height for the selected attribute instance. As the user moves the lever 952 to different height values, the height of the image representation 954 in the dialog box 950 correspondingly changes.

Figure 10A:
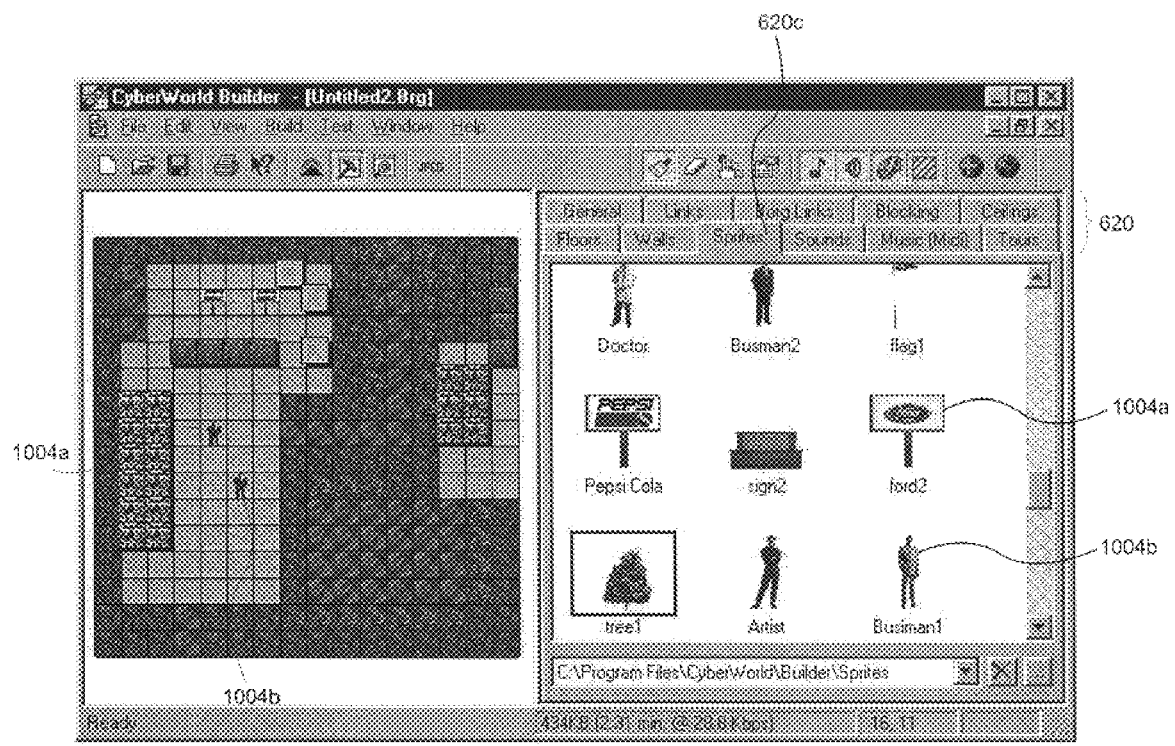
FIG. 10A is a screen shot illustrating the construction site of FIG. 9A after it has been populated with several different types of sprite objects in accordance with one embodiment of the present invention.

If the sprite tab 620c is selected, sprite objects are displayed within the attributes instance window 642. As shown in FIG. 10A, a plurality of sprites 904 are displayed within the palette 1042. A sprite object may include transparent portions that allow other objects on the tile to be visible within the 3D world. For example, a column of space within the 3D world may include a sprite object in the form of a statue that is positioned over a particular floor covering, such as a marble floor. Any portion of the marble floor that is not covered by the sprite object is visible and displayed within the 3D world. Likewise, a background image may be visible and displayed around the edges of the sprite object and within the associated column of space.

A sprite object may be in the form of a multi-sided 3D object, an animatible 3D object, or an animatible 2D object displayed on a 3D wall object. By way of examples, a sprite object be in the form of a multi-sided 3D free-standing person, a rotating statue, and a video-formatted billboard displayed on a wall of a building within the 3D world.

In one embodiment, a sprite object may be configured to be displayed at multiple angles within an associated 3D world. That is, a sprite object may include a plurality of frames that are sequentially displayed as a user walks around the sprite object in the associated 3D world. These frames may correspond to different sides of the same object so that different frames are seen from different viewing angles. In other words, a different frame may be used for each side of the object to simulate a multi-sided 3D object. The side or frame that is displayed depends on the viewing angle relative to the object. For example, if a sprite object has four sides, then a first frame may be displayed for the eastern side of the object, a second frame for the western side, a third frame for the southern side, and a fourth frame for the northern side. Of course, the number of frames may be increased (and thus the angle between frames decreased) to improve the visual experience.

Alternatively, the sprite object may be a rotating object within the 3D world. In this configuration, each frame of the sprite object is sequentially displayed to give the appearance (from the standpoint of a static viewer) that the sprite object is rotating. In yet another embodiment, the sprite object is animated. In this embodiment, a series of images are displayed from a particular viewing angle to give the appearance of animation (e.g., a billboard that appears in the form of a video clip) Of course, the sprite object may have only a single frame that is displayed for all viewing angles. In this case, a single side will always appear to face the user as she "walks" around the sprite object.

In one embodiment, a sprite object may be placed on a location of the construction site 601 that may also include other objects, such as a floor object or a wall object. If a sprite object is placed on the same location as a wall object, the sprite object may be rendered on a particular side of the wall object in the 3D world. For example, a sprite object that is in the form of an advertisement sign may be placed on the side of a wall object that is in the form of a building. In contrast, if that same advertisement sprite is placed on a location that does not include a wall object, the advertisement sprite takes the form of a free-standing 3D object within the 3D world.

Figure 10B:
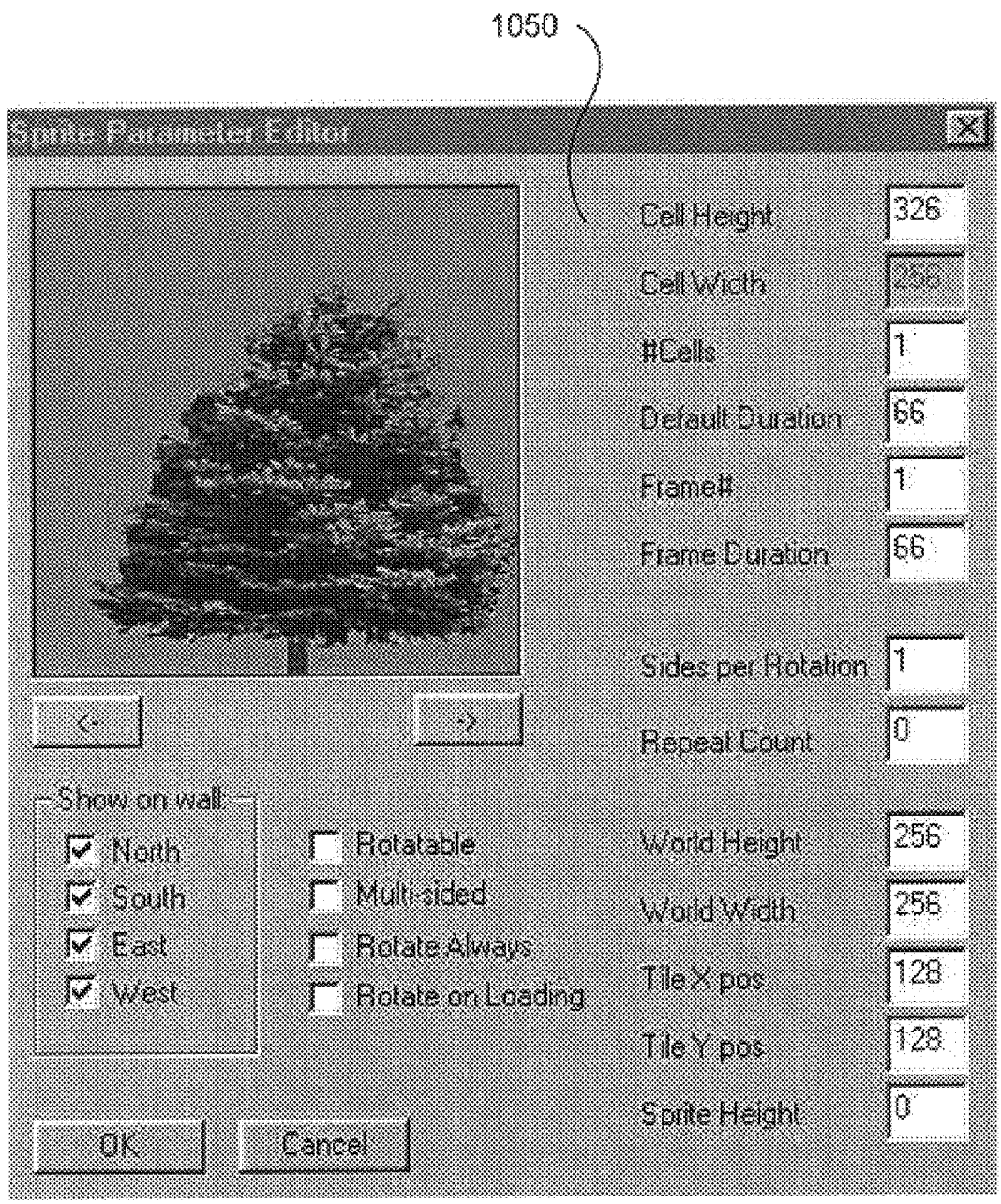
FIG. 10B is a screen shot illustrating a sprite dialog box 1050 for modifying characteristics of a sprite object of FIG. 10A in accordance with one embodiment of the present invention.

Each sprite object may include several modifiable characteristics. Thus, the GUI 600 include mechanisms for modifying the characteristics of the sprite object. Turning to FIG. 10B, by selecting the attribute modification tool 616 and a particular sprite object, a sprite dialog box 1050 may be displayed that is configured to receive a user's input, e.g., through a pointer or keyboard.

The sprite dialog box 1050 may allow modification of any suitable characteristics of a particular sprite object. As shown, the dialog box 1050 allows selection of a particular face of the associated wall object, upon which to display the sprite object. That is, when the sprite object is placed on a location of the construction site 601 that also has a wall object, the sprite object may appear on a north face, a south face, a east face, and/or a west face of the wall object. The sprite object may be configured to be rotatable, multi-sided, continuously rotatable, and/or rotatable on activation (as for example by tapping or clicking on the sprite object).

The sprite image may have any suitable format for creating a sprite object. In one embodiment, the sprite image is composed of a long vertical strip of cells, one after the other. The "cell width" may always be fixed to correspond to the width of the image. The "cell height" may be configurable within the dialog box 1050. In this embodiment, the number of cells is proportional to the cell height. That is, the cell height is equal to the total image height divided by the number of cells.

The "default duration" is the time that passes between when a current frame's display ends and another frame display begins. The default duration may be modified within the dialog box 1050. Any suitable range of values may be allowed. By way of example, a value between about 33 and 10,000 may be translated into an actual range of about thirty frames per second to one frame every ten seconds. Of course, the sprite object may not be animatible, and the default duration value is then disregarded.

The "frame number" indicates which cell is displayed in the dialog box 1050. A change to this value causes the appropriate frame to be displayed within the dialog box 1050. The right and left arrow buttons increment or decrement the currently displayed frame number. The "frame duration" is the length of time that the current frame will be displayed in an animated sprite object. This value may override the default duration, and may have no effect if the sprite object is not an animated object.

The "sides per rotation" entry specifies the number of frames that constitute a complete animation cycle. A default value may be set that is equal to the total number of cells in the sprite object, for example. The "repeat count" value may be used to modify the number of cycles to animate in cases where the sprite animation does not repeat infinitely. For example, a value of 1 indicates that one animation cycle will be displayed, and a value of 2 indicates that two animation cycles will be displayed. A zero value may be defined to indicate that the animation will continuously cycle.

The "world height" and "world width" values may be modified in the dialog box 1050 to change the apparent size of the 3D world so that it appears stretched or shrunk. The "tile X" and "tile Y" parameters may be modified to alter a position of the center of the sprite object with respect to the location in the construction site. In one embodiment, the construction site is divided into a 16 by 16 array of tiles, and each tile is divided into a 256 by 256 array of locations. A sprite object may be placed on a particular tile and on a particular location within such tile. In this case, each tile value may by set to a value between 0 and 255. A value of "0,0" represents the lower left hand corner of the particular location in the construction site 601.

The "sprite height" value may be modifiable and corresponds to the height of the sprite object as it appears with respect to the floor in the 3D world. For example, the height value may correspond to how high the sprite object appears above the floor image within the 3D world.

A "rotatable" selection button indicates that the sprite object may be animated. The "multi-sided" selection button indicates that the sprite object may display a different frame when viewed from different angles. The "rotate always" selection button indicates that the animation can not be terminated from within the 3D world. The "rotate on loading" button indicates that the sprite object is animated as soon as it is loaded, e.g., when the 3D world is rendered.

Figure 11:
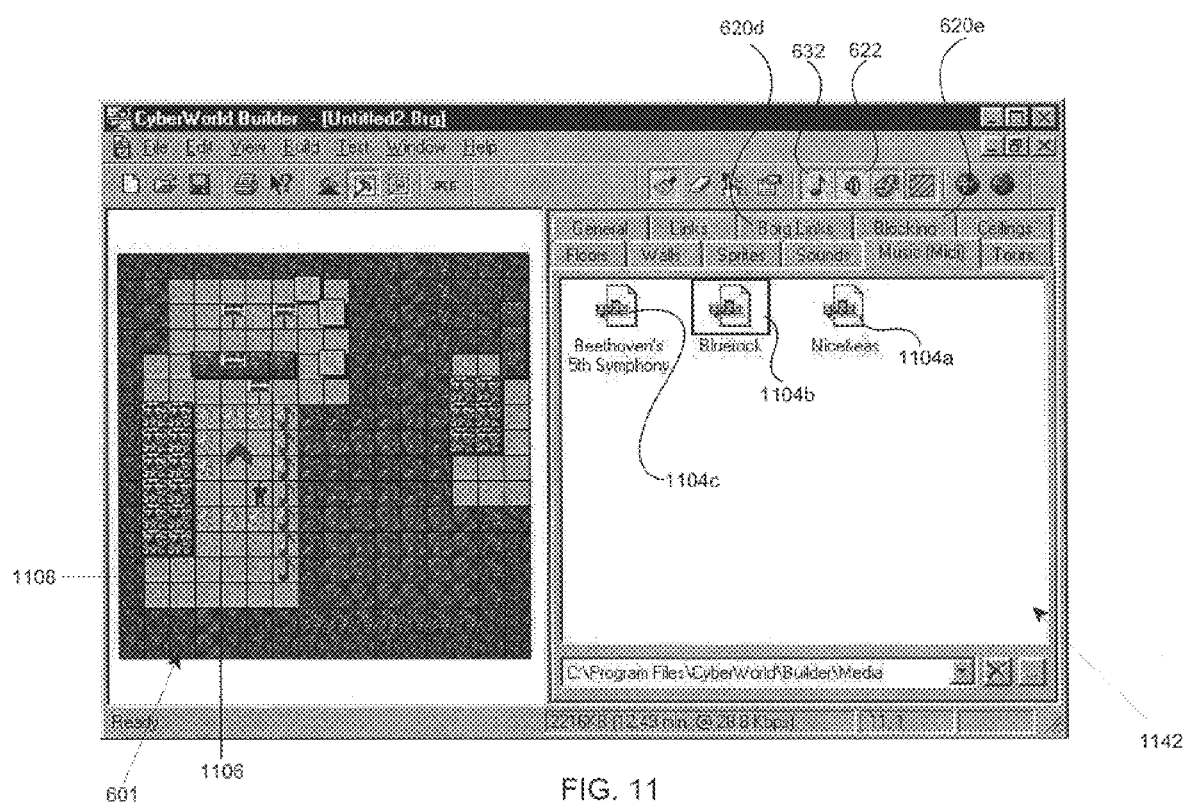
FIG. 11 is a screen shot illustrating the construction site of FIG. 10A after it has been populated with several different types of sound objects in accordance with one embodiment of the present invention.

Attribute instances may be in the form of sound objects, as well as image objects. The sound objects may include any suitable type of sound objects and may be grouped in any suitable manner. The sound objects may be blendable or nonblendable within the 3D world. In one embodiment, the sound objects are divided by types of sound format onto separate palettes. A selection of sound tab 120*d* displays a palette of wave type sound objects (not shown). As shown in FIG. 11, selection of MIDI tab 620*e* displays a palette 1142 of MIDI type sound objects 1104. Of course, other types of sound objects may be grouped on other tabs or grouped on the same tab as either the wave sound objects or the MIDI sound objects.

A particular sound object (e.g., 1104) may be selected and placed on a particular location (e.g., 1106) on the construction site 601. Each type of sound object may be represented by a different a type of icon on the construction site 601. As shown, a musical note 1106 is used to represent a MIDI object, and a speaker 1108 is used to represent a wave object.

Selection of the MIDI display button 632 displays or hides the wave sound objects on the construction site 601. The MIDI display button 622 may likewise be used to display the MIDI sound object on the construction site 601. This feature reduces clutter within the construction site 601 when it's populated with a relatively large number of attributes instances.

The attribute instances may also be in the form of a link to another object. In practice, the links can be made to any object that is recognizable by the current operating system and/or the viewer application. By way of one example, if the Microsoft Windows Operating System is used, the object may be any object that is executable by any Microsoft Windows application. By way of another example, a link may be a URL address to a particular web page or site, an Excel document that is executed by Microsoft Excel, or a plain bitmap file that is executed by Microsoft Paint program.

Figure 12:
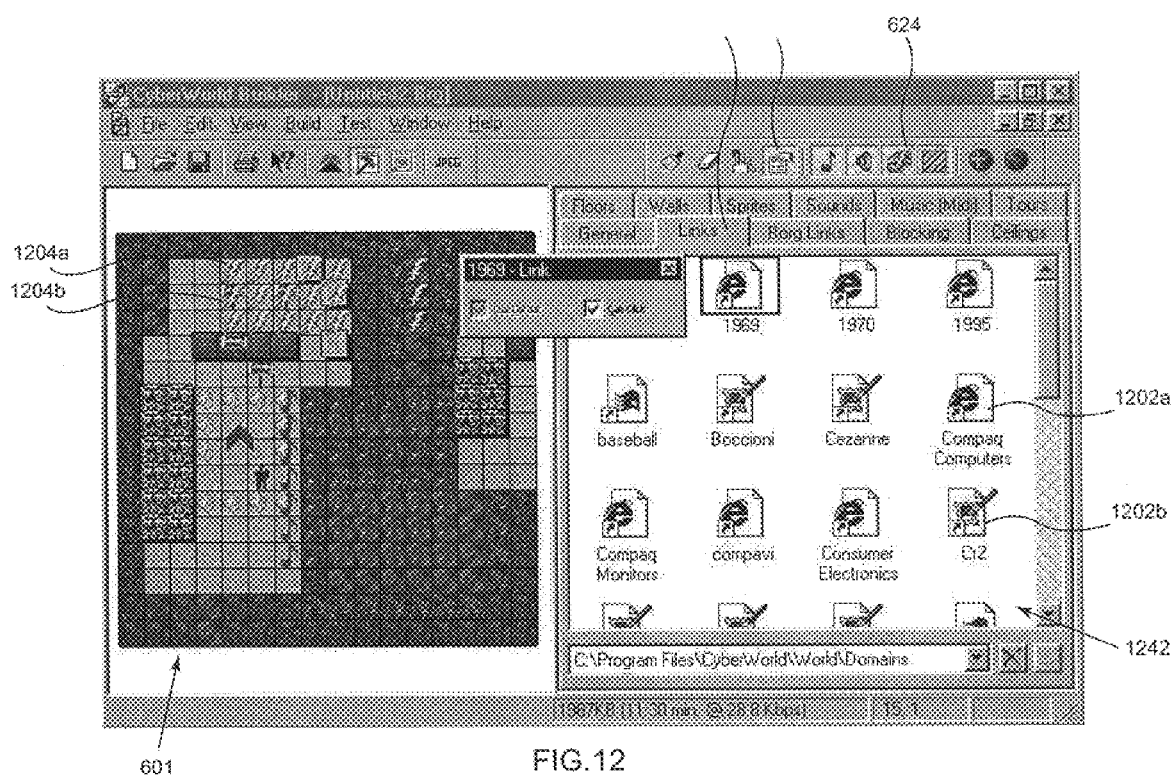
FIG. 12 is a screen shot illustrating the construction site of FIG. 11 after it has been populated with several different types of links in accordance with one embodiment of the present invention.

As shown in FIG. 12, a plurality of links are displayed within the palette 1242 by selecting the link tab 620*f*. The palette 1242 includes a URL web link 1202*a* to a Compaq computer site and a drawing document link 1202*b*. Selection of the link display button 624 displays or hides links within the construction site 601. When the links 1204 are displayed in the construction site 601, any suitable icon may be used to represent the link. In the embodiment shown, a lightening symbol is used to represent the links 1204 within the construction site 601. Alternatively, more than one icon type may be used to represent and differentiate various types of links.

In the described embodiment, the links may be activated in a variety of ways. For example, some links may be activated by simply passing over them in the viewer, while others may require the user to affirmatively select (as for example "click" on) the link. The characteristics of a particular link on the construction site 601 may be modified by selecting the attribute modification button 616 and the link of interest. When the attribute modification button 616 and a particular link are both selected, a link dialog box 1250 (as shown in FIG. 12) is displayed. In one embodiment, a click option may be selected for the particular link. When the click option is selected, a click on the link within the 3D world (e.g., the user may click on the link with a mouse) results in activation of the particular link. For example, a particular web site may be loaded by the viewer 102. In contrast, when the click option is not selected, the link is activated when the user simply moves over the particular location on the construction site that includes the link.

One or more locations on the construction site 601 and the associated 3D world may be configured to be associated with links to other 3D worlds. In other words, when the populated construction sites 601 is compiled into a data structure, this data structure may include links to other 3D worlds. In this embodiment, 3D worlds are in the form of manageably sized and size-delimited 3D worlds that may be infinitely linked with other similarly sized 3D worlds. This feature provides a relatively high level of flexibility in managing and organizing 3D worlds.

Figure 13:
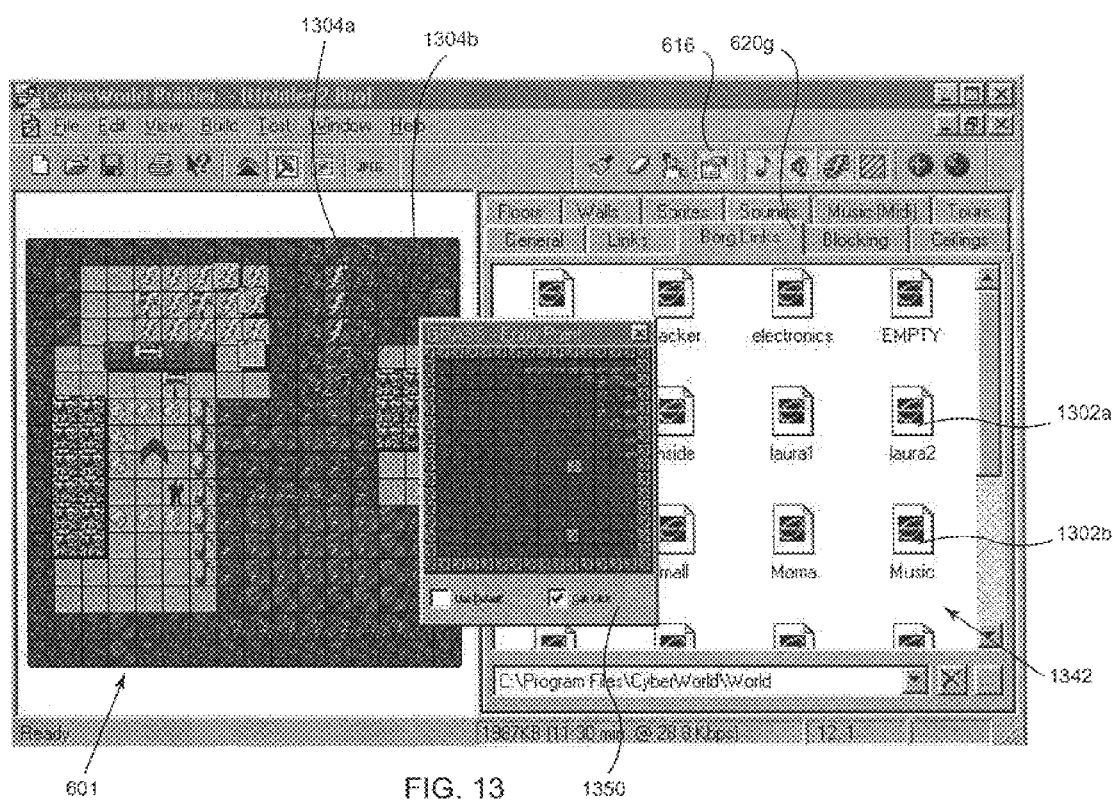
FIG. 13 is a screen shot illustrating the construction site of FIG. 12 after it has been populated with several different types of "Borg" links to other three dimensional worlds in accordance with one embodiment of the present invention.

As shown in FIG. 13, a plurality of links 1302 to other 3D worlds are displayed within a palette 1342 when the "Borg link" tab 620*g* is selected. A link dialog box 1350 may be displayed when the attributes modification button 616 and a particular attribute instance are selected. The dialog box 1350 allows selection of an entry point within the 3D world that is referenced by the construction site currently being populated. In other words, when the current construction site 601 and corresponding objects and links are rendered into a 3D world, a particular location within the 3D world will be linked to another 3D world that may be selected and rendered.

Figure 14:
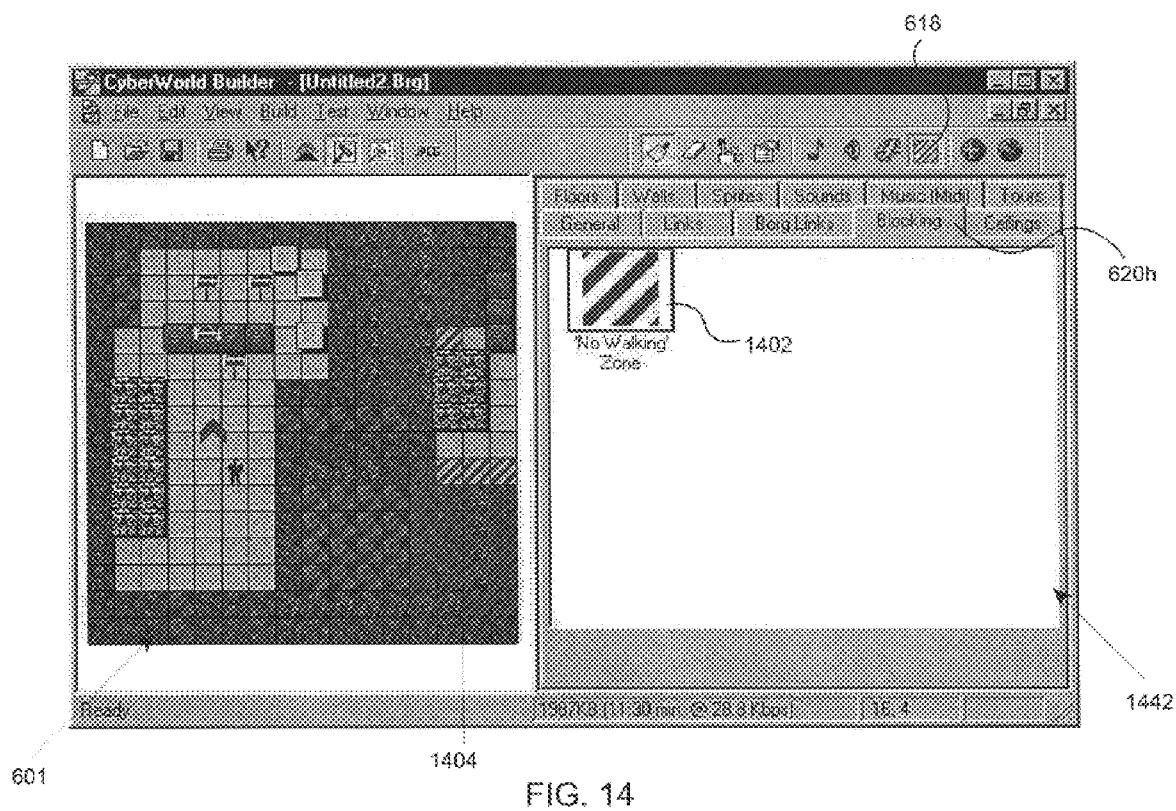
FIG. 14 is a screen shot illustrating the construction site of FIG. 13 after it has been populated with several different types of blocking objects in accordance with one embodiment of the present invention.

Movement within the 3D world may be limited by placing blocking attribute instances 1402 within the construction site 601. As shown in FIG. 14, a blocking tab 620*h* displays a blocking attribute instance 1402 within the palette 1442. This blocking attribute instance 1402 may be placed at one or more locations within the construction site 601. When a 3D world is generated from the construction site and corresponding object and links, movement is prohibited within the locations containing a blocking attribute instance 1402. The palette 1442 may include more than one type of blocking attribute instance. For example, a blocking attribute instance may prohibit particular kinds of movement, such as entering or exiting a location from a particular direction. Selection of the blocking display button 618 displays or hides blocking attributes instances on the construction site 601.

Figure 15:
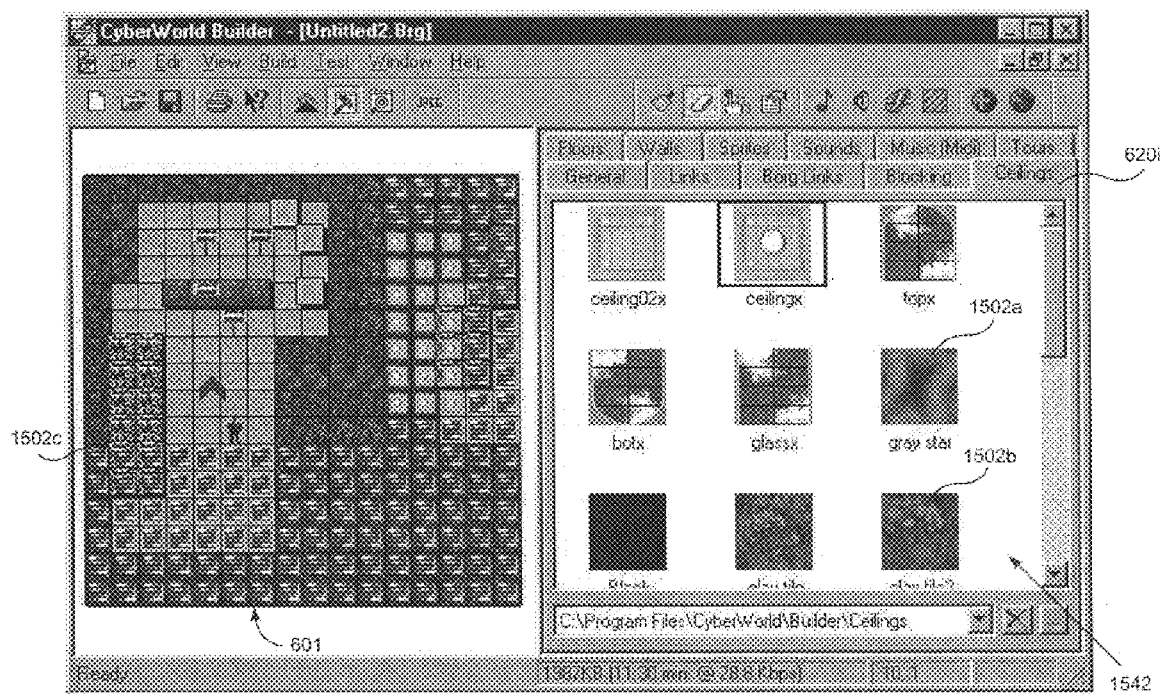
FIG. 15 is a screen shot illustrating the construction site of FIG. 14 after it has been populated with several different types of ceiling objects in accordance with one embodiment of the present invention.

Referring to FIG. 15, ceiling type attributes instances 1502 may also be displayed within a palette 1542 by selecting the ceiling tab 620*i*. Ceiling attribute instances 1502 may then be selected and placed or painted within the construction site 601. Ceiling attribute instances may take any suitable form within the 3D world. For example, ceilings may be in the form of different materials, such as tile, stucco, or glass. Ceilings may also take the form of various ceiling structures, such as chandeliers or skylights.

One or more tours may be defined within the populated construction site 601. A tour is defined as an automated path on which a user is taken within the 3D world. Along the path, various events occur. For example, specific sounds may be played or stopped at specific locations along the path; executable objects may be initiated at various points along the path; or various executable objects may be halted at various points along the path. As a user travels along a predefined tour route, the user may still interact with portions of the 3D world. For example, when a user moves over a location that contains a link, the link is activated.

Figure 16:
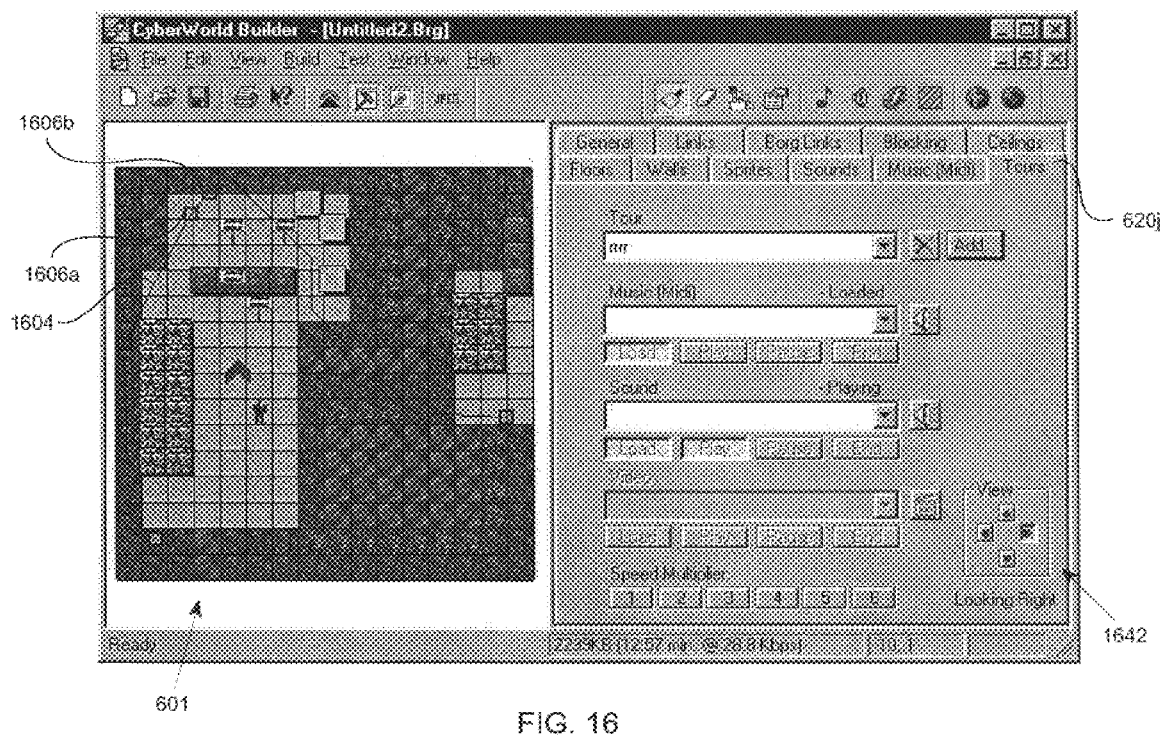
FIG. 16 is a screen shot illustrating the construction site of FIG. 15 after a it has been populated with a t our route in accordance with one embodiment of the present invention.

Referring to FIG. 16, when the tour tab 620*j* is selected, a tour input box 1642 is displayed for the currently selected location on the construction site 601. In one embodiment, music and/or a video clip may be selected, initiated, and/or terminated for the selected location. Additionally, a view direction and a speed may be selected for the user. Various locations on the construction site 601 may be modified to include events that are programmed via the tour input box 1642. Various programmed events on various associated locations are then linked together into a tour path 1604. As shown, the construction site 601 includes a tour path 1604 with a plurality of events 1606.

Figure 17:
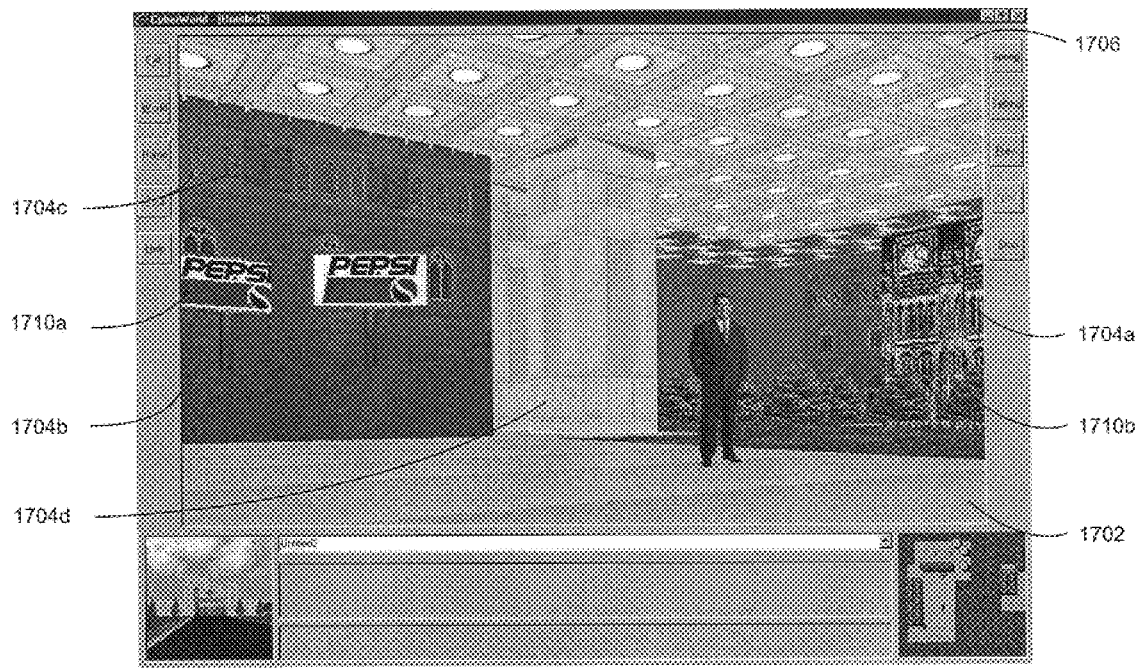
FIG. 17 is a screen shot of a portion of a three dimensional world rendered from the populated construction site of FIG. 16 in accordance with one embodiment of the present invention.

After a particular construction site has been built using the facilities described above, the builder data is compiled into a data structure that is usable by the viewer 102 of FIG. 1 to rendered the 3D world that has been created. FIG. 17 is a screen shot of a portion of a 3D world rendered from the populated construction site of FIG. 15 in accordance with one embodiment of the present invention.

The various objects and links on the construction site 601 are each rendered as 3D visible objects or executable objects and/or links within the 3D world. For example, the floor objects on the construction site are rendered as floor portions 1702 within the 3D world. Different types of floor objects may be rendered differently within the 3D world. For instance, a first type may be rendered as a carpet portion and a second type may be rendered as a brick sidewalk portion.

Similarly, different types of wall objects may be rendered as different wall objects or portions within the 3D world. As shown, a first wall object 1704*a* is in the form of an exit to the outside of a building. A second wall object 1704*b* is in the form of an interior wall face having a plurality of windows 1704*c*. A third wall object 1704*d* is in the form of a column structure. Different types of ceiling objects may also be rendered as different ceiling portions 1706 within the 3D world.

Different types of sprite objects may be rendered differently within the associated 3D world. That is, different sprite objects may be rendered as visually different 3D objects within the associated 3D world. Additionally, a particular sprite attribute instance may be displayed differently within the 3D world. For example, the sprite objects behavior may depend on where it is placed within the 3D world. As shown, a first sprite object 1710*a* is in the form of a sign that is displayed on a wall object 1704*b*. If that same first sprite object 1710*a* is placed at a location without a wall object, it is displayed as a stand-alone 3D object. As shown, a second sprite object 1710*b* is in the form of a person standing within the 3D world.

Particular locations within the 3D world and each of the visually rendered 3D objects (e.g., floors, walls, sprites, and ceilings) may also have associated executable objects, such as sound objects. That is, as one travels within the 3D world, sounds are played as a user passes over a particular location within the 3D world. Likewise, some visually rendered objects may also be associated with an executable object, such as a video clip or a URL site. In the case of the URL site, the corresponding web page is loaded.

The present invention may provide a useful metaphor for organizing various executable objects and links. By way of example, URL sites may be organized in a familiar way. By way of specific example, a 3D mall interior may be built, and each shop within the mall may be associated with a corresponding URL address. A pet shop may be associated with a particular pet company URL address that allows the user to order pet supplies.

The populated construction sites and corresponding 3D worlds may also be linked together in logical super-constructs. For example, the 3D pet store may include a link to another 3D world in the form of a book store that specializes in animal subject matter. The specialized book store may include 3D books that are, in turn, linked to texts objects that summarize particular books to help a customer make a selection and purchase.

Figure 18:
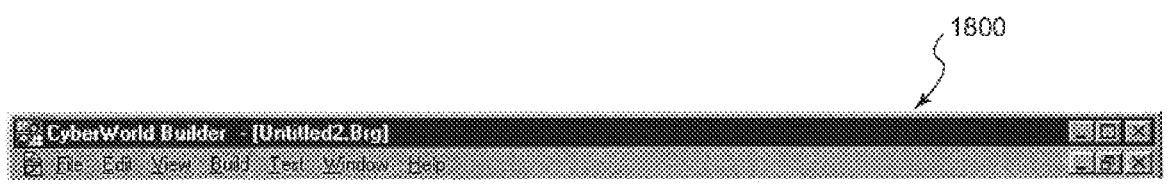
FIG. 18 is a screen shot of a tool bar within the builder of FIGS. 6 through 17 in accordance with one embodiment of the present invention.

The 3D world is rendered from a compiled data structure that is associated with a populated construction site and its associated objects and/or links. The populated construction site is compiled within the builder 100. FIG. 18 is a screen shot of a tool bar 1800 within the builder 100 of FIGS. 6 through 17 in accordance with one embodiment of the present invention. The tool bar 1800 includes standard pull down menus (not shown) for standard file management functions, such as "open file" and "save file." Additionally, the tool bar 1800 includes features that are specific to the present invention. For example, the tool bar 1800 includes a pull down menu for compiling the populated construction site and testing the resulting 3D world.

Before the construction site may be compiled, it is populated and/or associated with one or more objects and/or links. As described above, the builder 100 provides a graphical user interface for populating constructions sites. As a particular construction site is being populated, data associated with modifications or additions to the construction site is stored for use in the corresponding data structure. For example, data may be stored until it is compiled into a data structure. Alternatively, data may be stored within the data structure as the construction site is being populated. Any suitable mechanisms may be implemented for creating the data structure.

Builder Mechanism Embodiments for Generating 3D Worlds

Figure 19:
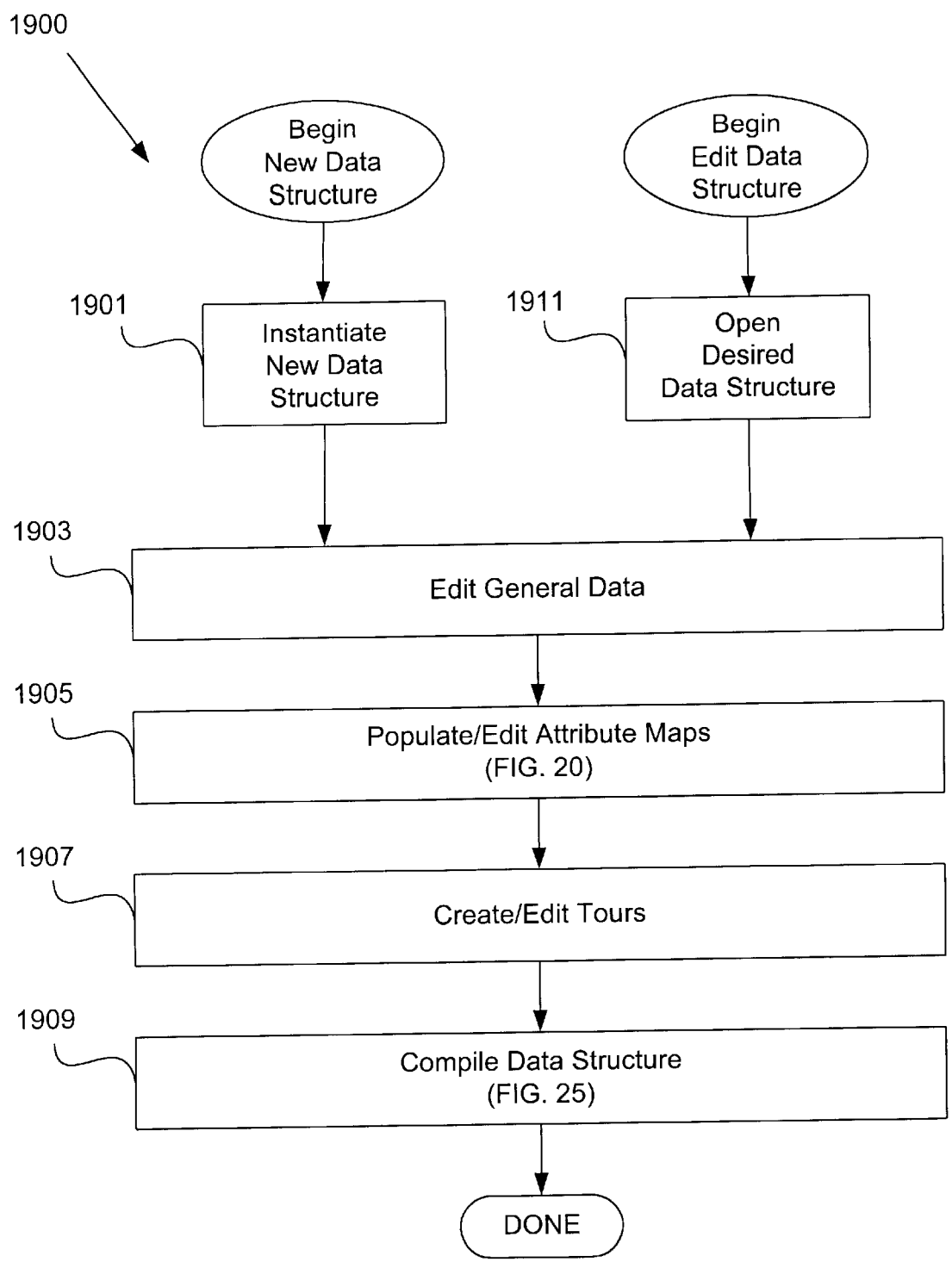
FIG. 19 is a flowchart illustrating a process for populating or modifying a construction site in accordance with one embodiment of the present invention.

FIG. 19 is a flowchart illustrating a process 1900 for populating or modifying a construction site in accordance with one embodiment of the present invention. A new construction site is substantiated in operation 1901, or an existing construction site is opened in operation 1911. If an new construction site is substantiated, several parameters may be set to default values that define certain aspects of the rendered 3D world. For example, a height for the 3D world may be set to a default height value.

General data is then modified and/or generated in operation 1903. General data includes data that is not associated with a particular location within the populated construction site. After the general data is generated, the attribute maps are populated or modified in operation 1905. In general terms, the attribute maps are populated by placing selected attribute instances onto the construction site. Operation 1905 is further described below in reference to FIGS. 20 through 24.

Tours may then be created or modified in operation 1907. A data structure based on the populated attribute maps, general data, and tour data is then compiled in operation 1909. The compiled data structure will include, for example, references to attribute instances and/or tour data that were associated with the construction site. Operation 1909 is further described below as reference to FIGS. 25 through 33.

Figure 20:
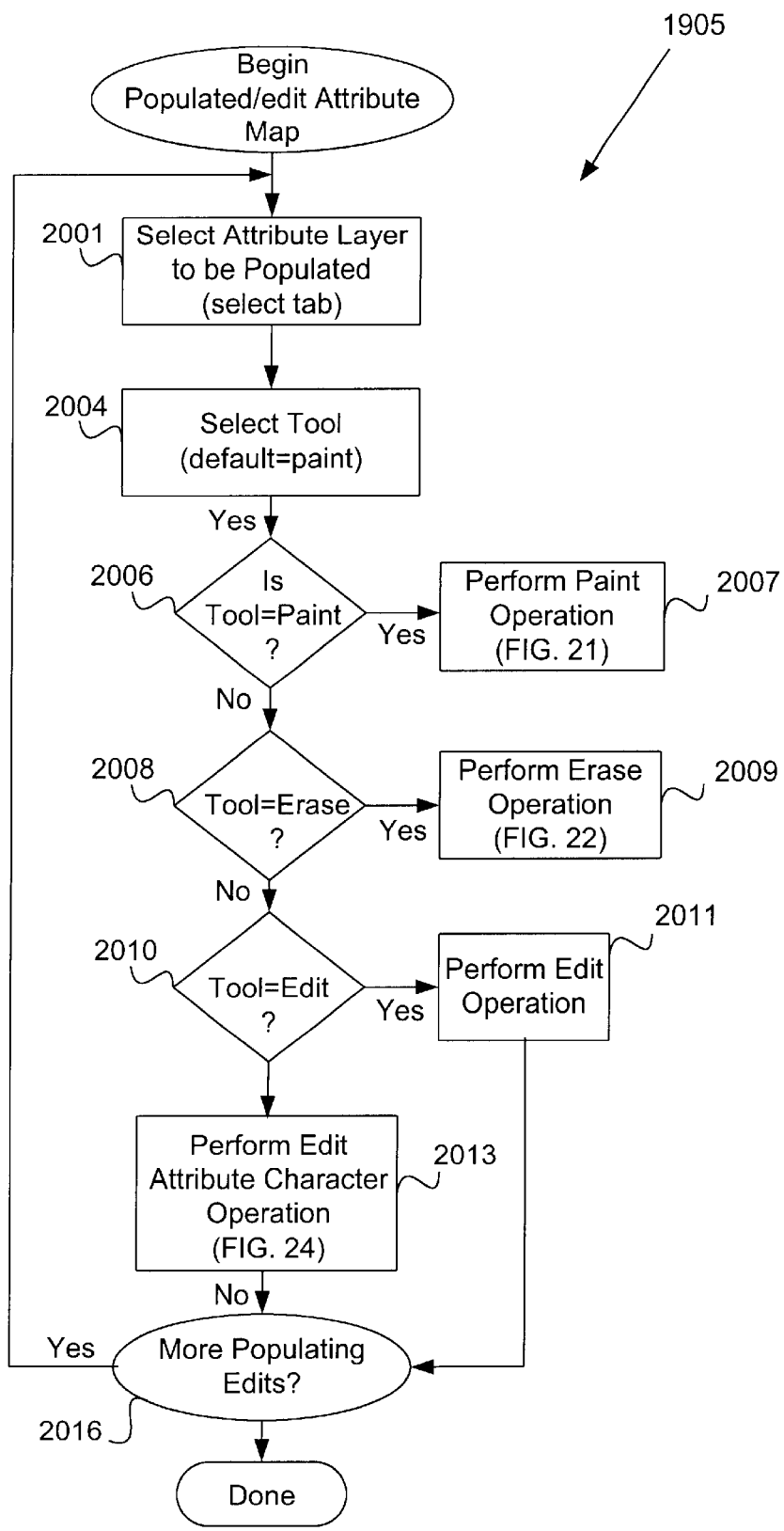
FIG. 20 is a flowchart illustrating the operation of FIG. 19 of populating or editing the attribute maps in accordance with one embodiment of a present invention.

FIG. 20 is a flowchart illustrating the operation 1905 of FIG. 19 of populating or editing the attribute maps in accordance with one embodiment of a present invention. Initially, an attribute map is selected in operation 2001. For example, a particular tab 620 of the GUI may be selected so that associated attribute instances are displayed within the attribute display window 642.

A tool 610 may then be selected in operation 2004. Of course, a default tool selection value may already be set and this step is not required. In one embodiment, the default tool is the paint tool 610. Other tools that may be selected are the erase tool 612, the edit tool 614, or the attribute modification tool 616.

In operations 2006 through 2012 it is determined whether the paint tool, the erase tool, the edit tool, or the attribute modification tool has been selected. If the paint tool has been selected, a paint operation is performed in operation 2007. If the erase tool is selected, an erase operation is performed in operation 2009. If the edit tool is selected, an edit operation is performed in operation 2011. If the attribute modification tool is selected, an attribute modification operation is performed in operation 2013.

It is then determined whether there are more edits to perform within another attribute map in operation 2016. If there are no more edits, the process 1905 ends. If there are more edits, the process 1905 returns to operation 2001, and a new attribute map is selected.

Figure 21:
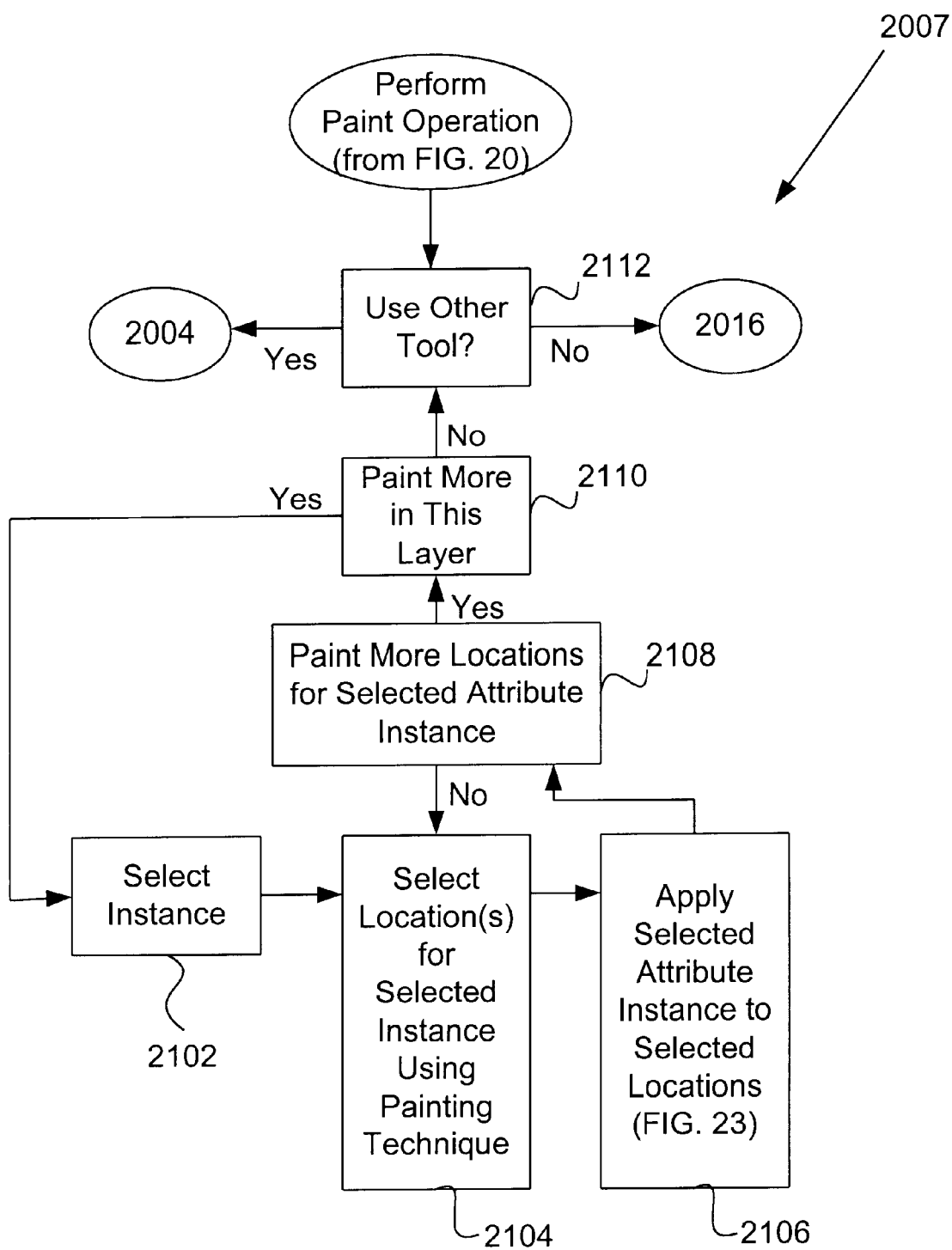
FIG. 21 is a flowchart illustrating the operation of FIG. 20 for performing a paint operation in accordance with one embodiment of the present invention.

FIG. 21 is a flowchart illustrating the operation 2007 of FIG. 20 for performing a paint operation in accordance with one embodiment of the present invention. Initially, an attribute instance is selected in operation 2102. In one embodiment, the attribute instance is selected from a palette that is displayed within the attribute instance display window 642. One or more locations or tiles are then selected using a paint technique in operation 2104.

The selected attribute instance is then applied to the selected tiles in operation 2106. It is then determined whether the selected attribute instance is to be placed on more locations within the construction sites in operations 2108. If more locations are to be selected, operations 2104 and 2106 are repeated, and more locations are selected, and the selected attribute instance is applied to the selected locations.

If the selected attribute instance is not to be applied to more tiles, it is then determined whether a new attribute instance is to be selected within this attribute layer in operation 2110. If a new attribute instance is desired, a new attribute instances is selected in operation 2007, and it is applied to selected locations in operations 2104 and 2106.

When no more attribute instances are to be selected from the current attribute layer and applied to the construction site using the selected tool, it is determined whether another tool selection is desired in operation 2112. If another tool is to be selected, the process 2007 returns to operation 2004 of FIG. 20 and another tool is selected. If another tool is not to be selected, the process 2007 then returns to operations 2016 of FIG. 20, where it is determined whether another attribute layer will be selected.

Figure 22:
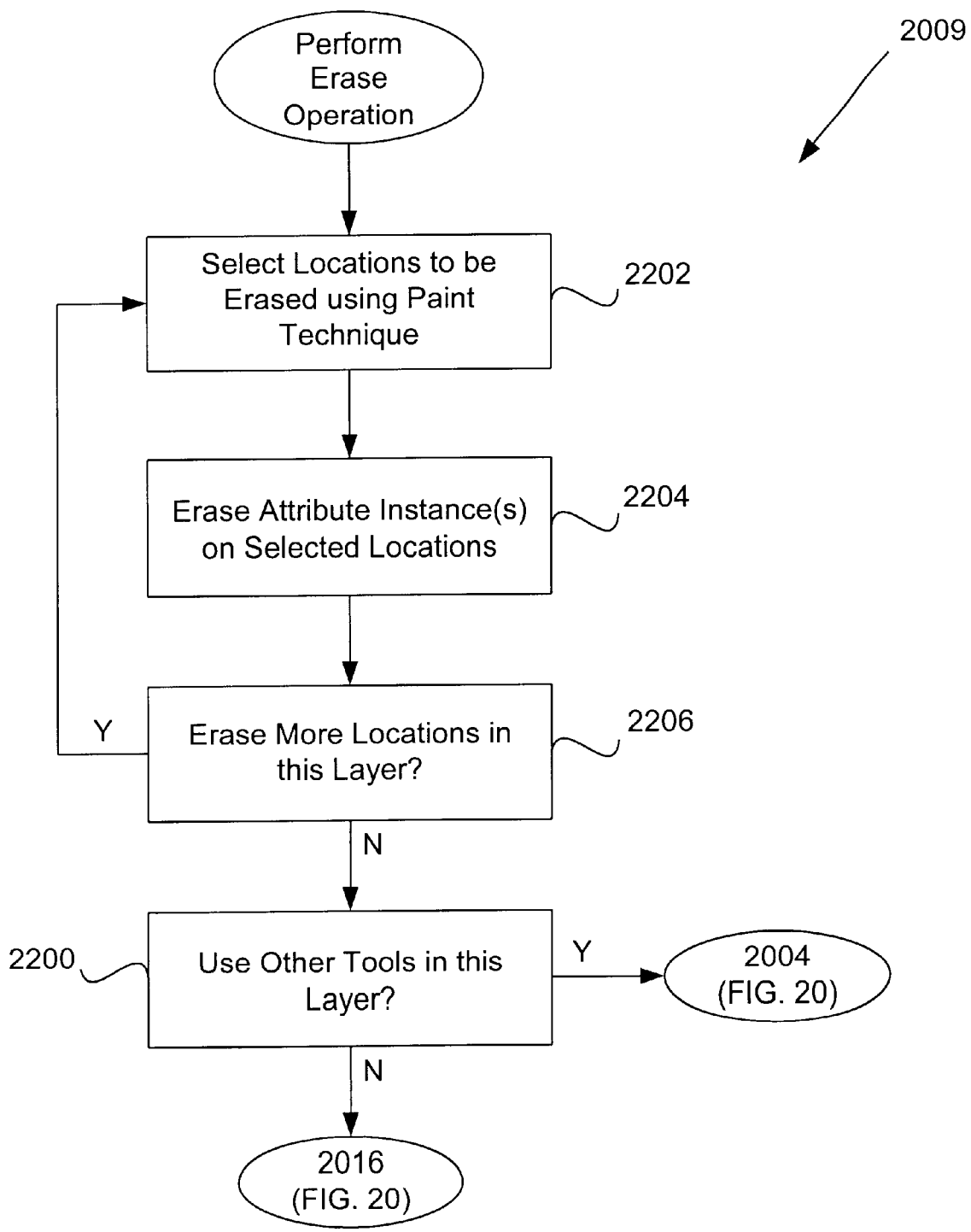
FIG. 22 is a flowchart illustrating operation of FIG. 20 for performing an erase operation in accordance with one embodiment of the present invention.

FIG. 22 is a flowchart illustrating operation 2009 of FIG. 20 for performing an erase operation in accordance with one embodiment of the present invention. Locations within the construction site are selected using a paint technique in operation 2202 such that attribute instances associated with the selected attribute layer on the selected locations are then erased in operation 2204. It is then determined whether more attribute instances associated with the selected attribute layer are to be selected and erased in operation 2206.

If more attribute instances are to be erased, more locations are selected for erasure in operation 2202. If it is determined, however, that no more locations are to be erased, it is then determined whether any other tool will be applied to the currently selected attribute layer in operation 2208. If it is determined that another tool will be applied, the process 2009 proceeds to operation 2004 of FIG. 20, where another tool is selected. If, however, it is determined that other tools are not to be applied to this attribute layer, the process 2009 proceeds to operation 2016 of FIG. 20. In operation 2016, it is determined whether additional edits will be performed on the construction site (e.g., by selecting another attribute layer).

Figure 23:
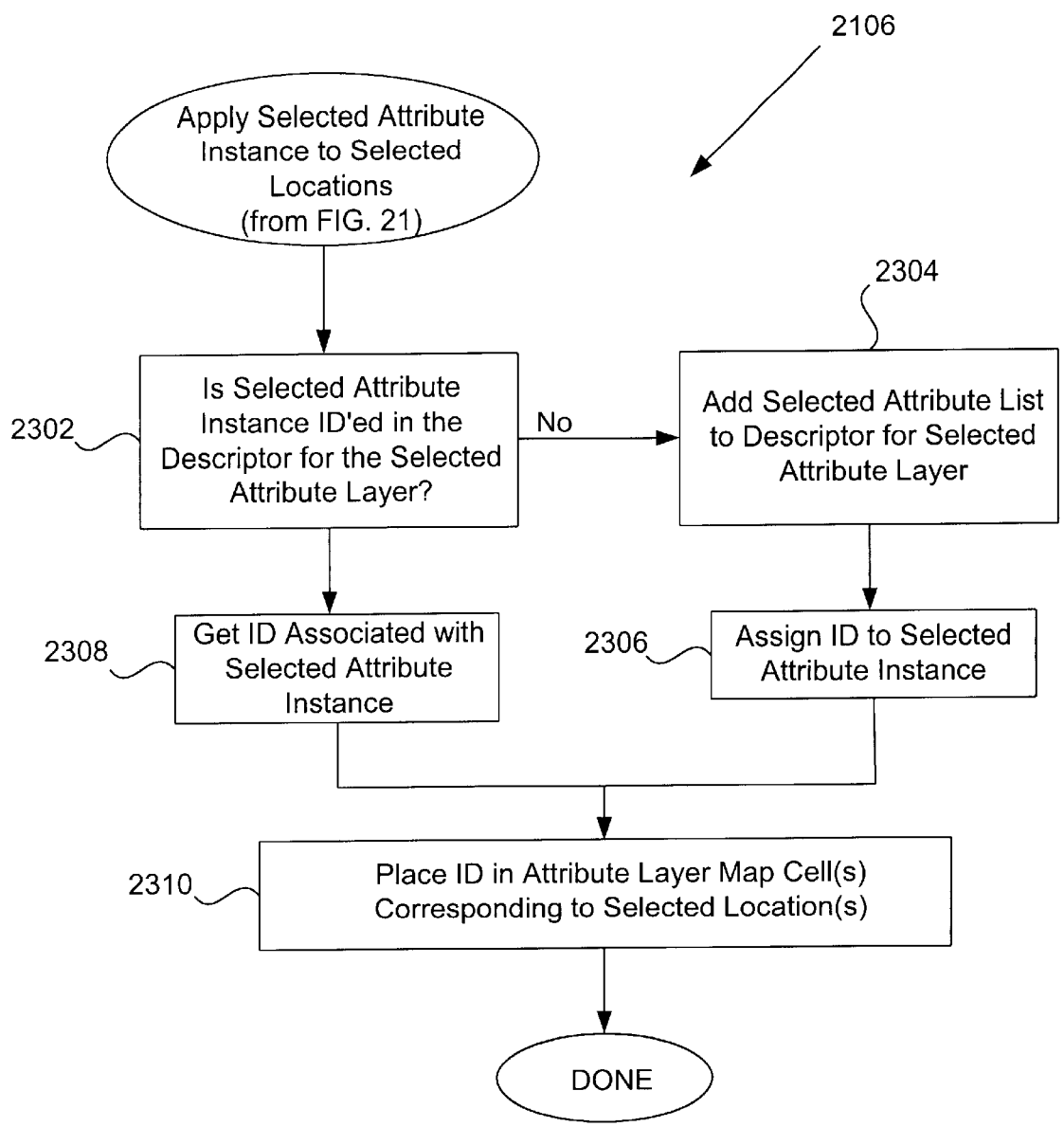
FIG. 23 is a flowchart illustrating the operation of FIG. 21 for applying the selected attribute instance to the selected location(s) in the construction site in accordance with one embodiment of the present invention.

FIG. 23 is a flowchart illustrating the operation 2106 of FIG. 21 for applying the selected attribute instance to the selected location(s) in the construction site. Initially, it is determined whether the selected attribute instance is identified in the descriptor for the selected attribute layer in operation 2302. If it is not identified, the selected attribute instance is added to the descriptor for the selected attribute layer in operation 2304.

However, if the attribute instance is identified in the descriptor, an identifier associated with the selected attribute instance is obtained from the descriptor in operation 2308. After the identifier is either obtained from the descriptor or newly assigned to the selected attribute instance, the identifier is then placed within the attribute layer cell(s) that correspond to the selected location(s) in operation 2310. The process 2106 then ends.

Figure 24:
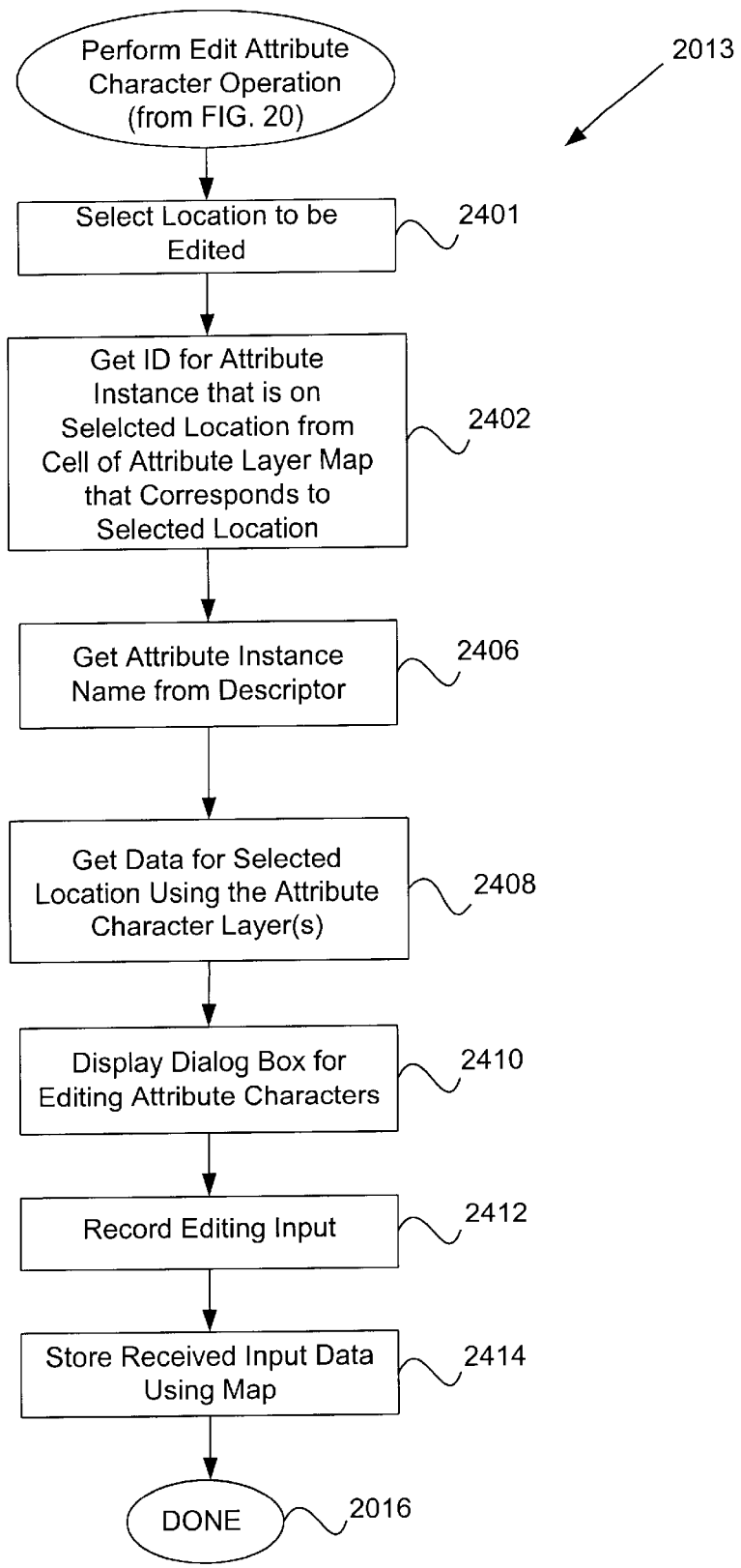
FIG. 24 is a flowchart illustrating operation of FIG. 20 of performing an attribute modification operation in accordance with one embodiment of the present invention.

FIG. 24 is a flowchart illustrating operation 2013 of FIG. 20 of performing an attribute modification operation in accordance with one embodiment of the present invention. Initially, a particular location in the construction site 601 is selected in operation 2401. An identifier for the attribute instance that is on the selected location is then obtained from a cell of the selected attribute layer maps that corresponds to the selected location in operation 2402. The attribute instance's name is then obtained from the descriptor based on the obtained identifier in operation 2406.

Data is then obtained for the selected location using the attribute layer map and descriptor information in operation 2408. Data may be in any suitable format. For example, the data may be an actual data value or a reference to other data values located outside of the descriptor. After data is obtained for the selected location, a dialog box is then displayed for editing the attribute characteristics in operation 2410. Editing input data (e.g., a size value for the selected attribute instance) is then received in operation 2412. The received input data is then stored in operation 2414. The process 2013 then proceeds to operation 2016 of FIG. 20, where it is determined whether any more edits are to be performed on the construction site 601.

FIG. 25 a flowchart illustrating the operation 1909 of FIG. 19 of compiling a completed construction site 601 in accordance with one embodiment of the present invention. Initially, image data is processed in operation 5000. The image data includes any type of image object. In one embodiment, the image data includes floor images, wall images, sprite objects, ceiling objects, background images, an emblem image, and a birdseye view image. Image data may include image objects that are displayed at a particular location within the 3D world or image objects that are displayed elsewhere within the viewer 102.

Non-image data is then processed in operation 5100. In one embodiment non-image data includes sound objects, video clips, object links, and any type of executable object. Each object or link may be associated with a particular location on the construction site 601 or may be in the form of general data that is associated with the entire 3D world.

The processed image data and non-image data is then compiled into a data structure in operation 5200. The data structure is organized such that efficient rendering may take place based on information within the data structure. Compilation of the data structure is further described below in reference to FIG. 33. Once the data structure is compiled, it is transferred to a repository, along with any associated files, in operation 5300. The repository may be any suitable storage medium located at any suitable location. For example, the repository may be located on the local hard drive, a local server, or on an external server. After the data structure is transferred, the process 1909 for compiling the data structure then ends.

FIG. 26 is a flowchart illustrating the operation 5000 of FIG. 25 of processing image data in accordance with one embodiment of the present invention. Initially, image layers or attribute layers are processed in operation 5010. In general terms, the descriptors (e.g., 154 of FIG. 2) are generated or modified based on the results from processing the image layers.

A birdseye view image or 2D image is then generated in operation 5600. The 2D image is a 2D representation of the 3D representation or world from a particular perspective (e.g., from a birdseye perspective). The birdseye view may be output for use by the viewer 102. For example, a birdseye view image file may be referenced by the data structure for the populated construction site, and the birdseye image file will be used to generate the 2D representation in the viewer 102. Alternatively, the viewer 102 may generate the birdseye view.

Single images are then validated in operation 5060. Single images may include, for example, the emblem, the birdseye view maps, and the background. For example, single images are the images that are not specifically tied to a location within the construction site 601. Validation of the single images include any suitable validation techniques for verifying whether the single images may be accepted by the viewer. For example, validation may include determining whether a selected emblem image is accessible.

One or more color palettes may then be constructed for the image files in operation 5080. In general terms, a custom palette of colors is generated for one or more of the images such that an optimal set of colors that are to be used within the image are defined within the palette(s). Construction of the palettes is further described below in reference to FIG. 30. After the color palette(s) are constructed, processing of the image data is complete.

Figure 27:
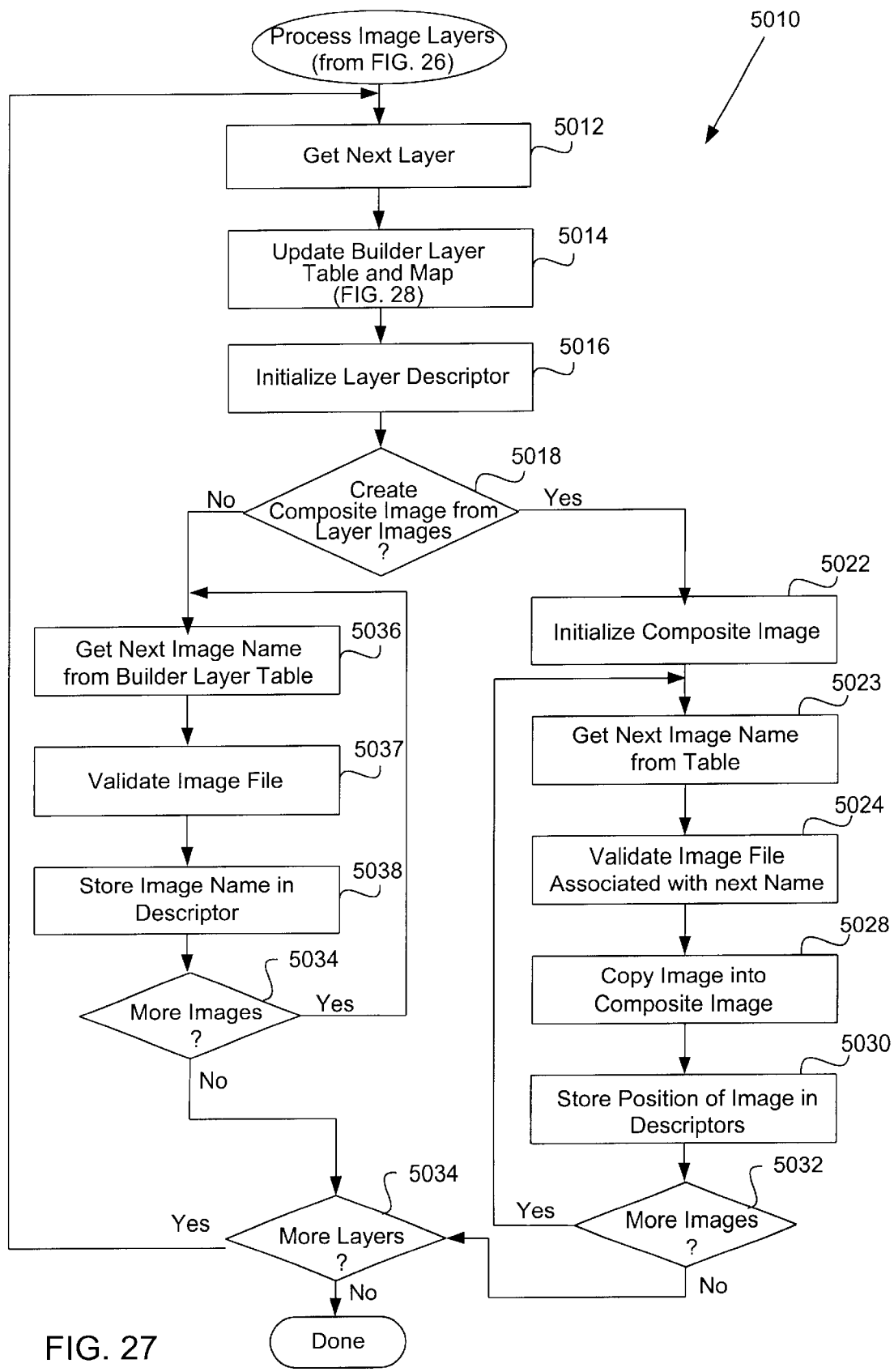
FIG. 27 is a flowchart illustrating the process of FIG. 26 of processing image layers in accordance with one embodiment of the present invention.

FIG. 27 is a flowchart illustrating the process 5010 of FIG. 26 of processing image layers in accordance with one embodiment of the present invention. Initially, a first attribute layer is obtained in operation 5012. By way of example, a floor layer may be obtained.

A builder layer table and attribute map are then updated in operation 5014. The builder layer table is analogous to the descriptor for the same layer and matches identifiers within the attribute map to attribute instances (e.g., objects and/or links). Updating of the layer table and attribute maps are further described below in reference to FIG. 28.

A descriptor associated with the obtained attribute layer is then initialized in operation 5016. The descriptor may include additional information that is not included within the attribute layer table. For example, the layer table may contain names to all of the individual image files, while the descriptor contains references to different images within a single compiled image file. In other words, the layer table and the descriptor are both configured to store references to objects and/or links that are implemented on the current construction site 601.

After the descriptor is initialized, it is determined whether a composite image will be created from a plurality of layer images in operation 5018. In other words, it is determined whether a plurality of images will be stored in a single composite image file. By way of example, a floor layer may include three different types of floor images: a marble floor, a brick floor, and a slate floor. The three different floor images may be stored contiguously within the same composite image file.

If a composite image is to be created, a composite image file is initialized in operation 5022. A first image name is then obtained from the layer table in operation 5023. The image file associated with the image name is then validated in operation 5024. The image for the particular location within the construction site is copied into the composite image in operation 5028. A position of this first image within the composite image is then stored within the descriptor in operation 5020. It is then determined whether there are more images for the current layer in operation 5032.

The remaining names for the remaining images are then obtained from the layer table in operation 5023. The associated image files are then validated in operation 5024, and stored within the composite image in operation 5028. The positions of the images are each stored within the descriptor in operation 5030.

It is then determined whether any more layers are to be processed in operation 5034. If no more layers are to be processed, the operation 5010 ends. However, if there are more layers, the process 5010 is repeated at operation 5012.

If a composite image is not going to be created for a particular attribute layer, a first image name is obtained from the builder layer table in operation 5036. An image file associated with the image name is then validated in operation 5027. This image name is then stored within the descriptor in operation 5038.

It is then determined whether there are any more image for the current attribute layer in operation 5039. If there are more images, the remaining names for the remaining images are obtained, and the associated image files are validated in operation 5036 and operation 5037, respectively. The image names are then stored within the descriptor in operation 5038. When there are not any more images, it is then determined whether there are any more attribute layers to process in operation 5034. If there are more attribute layers, the entire operation 5010 repeats for the next attribute layer starting at operation 5012. If there are no more attribute layers, the process ends.

Figure 28:
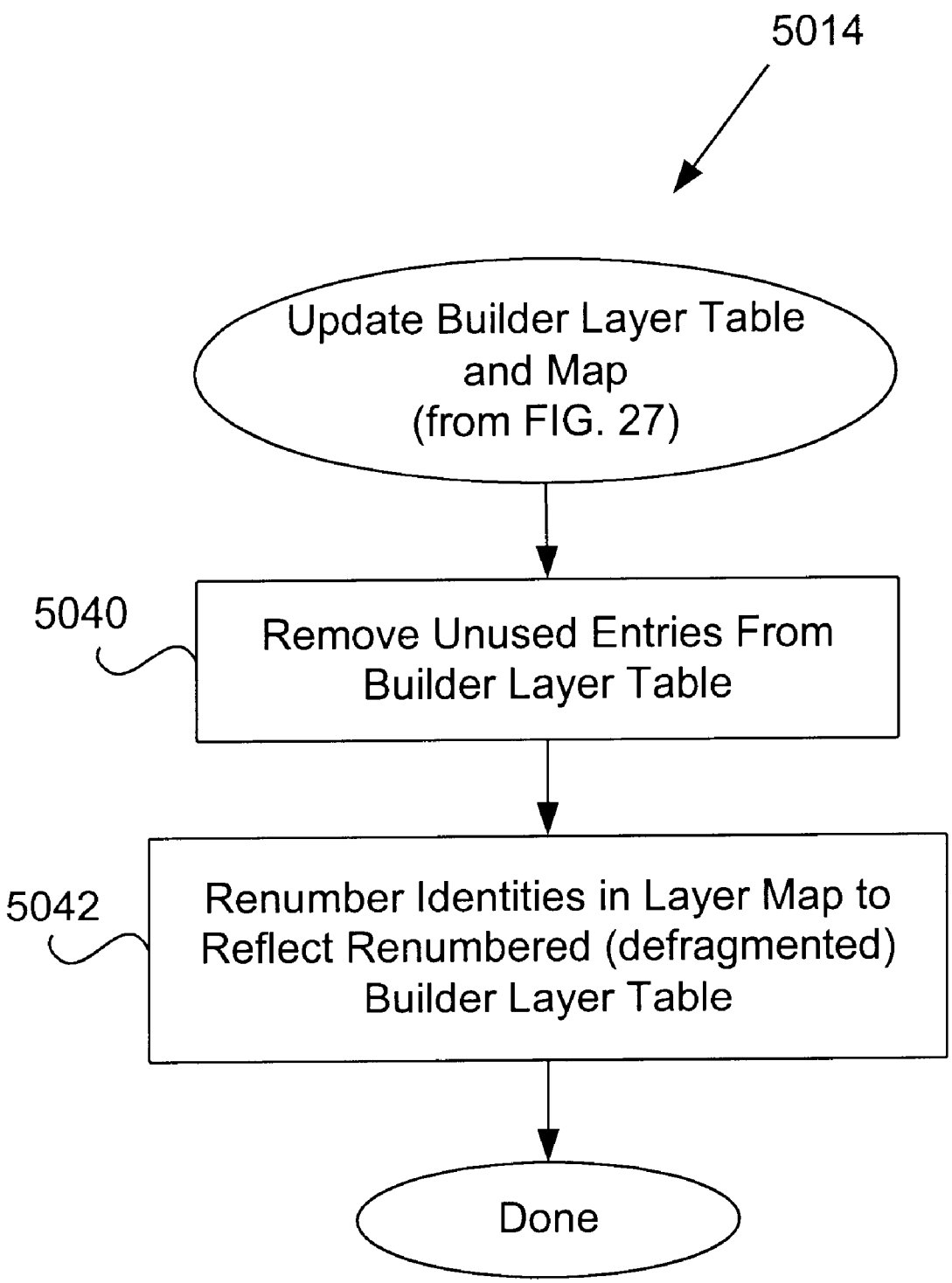
FIG. 28 is a flowchart illustrating the operation of FIG. 27 for updating the builder layer table and attribute layer map in accordance with one embodiment of the present invention.

FIG. 28 is a flowchart illustrating the operation 5014 of FIG. 27 for updating the builder layer table and attribute layer map. Initially, unused entries are removed from the builder layer table in operation 5040. That is, the layer table is updated to include any modifications to the construction site. If specific attribute instances have been deleted from the construction site, references to the attribute instance may also be deleted from the builder layer table. If specific attribute instances have been added to the construction site, references to the added attribute instances may be inserted within the builder layer table.

The builder layer table is configured to contain a list of all attribute instances of the associated attribute layer that are used to populate the construction site. Thus, if a particular attribute instance no longer exists on the associated layer, an entry for the particular attribute instance will be deleted from the builder layer table in operation 5040. Likewise, if a particular attribute instance is being used and is not represented within the layer table, a reference is added to the table.

Identifiers within the attribute layer map may then be renumbered to reflect any renumbering of the attribute instances referenced within the updated builder layer table in operation 5042. As attribute instances references are deleted from and/or added to the layer table, the references in the layer table are renumbered. These numbers are then associated with particular locations within the attribute layer map.

For example, prior to modification a construction site may include three different floor attribute instances: a marble floor, a brick floor, and a slate floor. The attribute instances are numbered respectively within the layer table as 1, 2, and 3. Likewise, within the associated attribute layer map, the location that contains a marble floor will be labeled as a 1; the location that contains the brick floor as a 2; and the location that contains the slate floor as a 3.

After modification the construction site may include only two floor attribute instances: a marble floor and a brick floor. Until it is updated, the layer table includes references to the marble floor, the brick floor, and the slate floor. After the layer table is updated in operation 5040 to include only references to a marble floor object and a slate floor object, these object references are renumbered as 1 and 2, respectively. Within the attribute map, locations associated with a slate floor object will be renumbered as 2 to match the renumbered references within the layer table.

Figure 29:
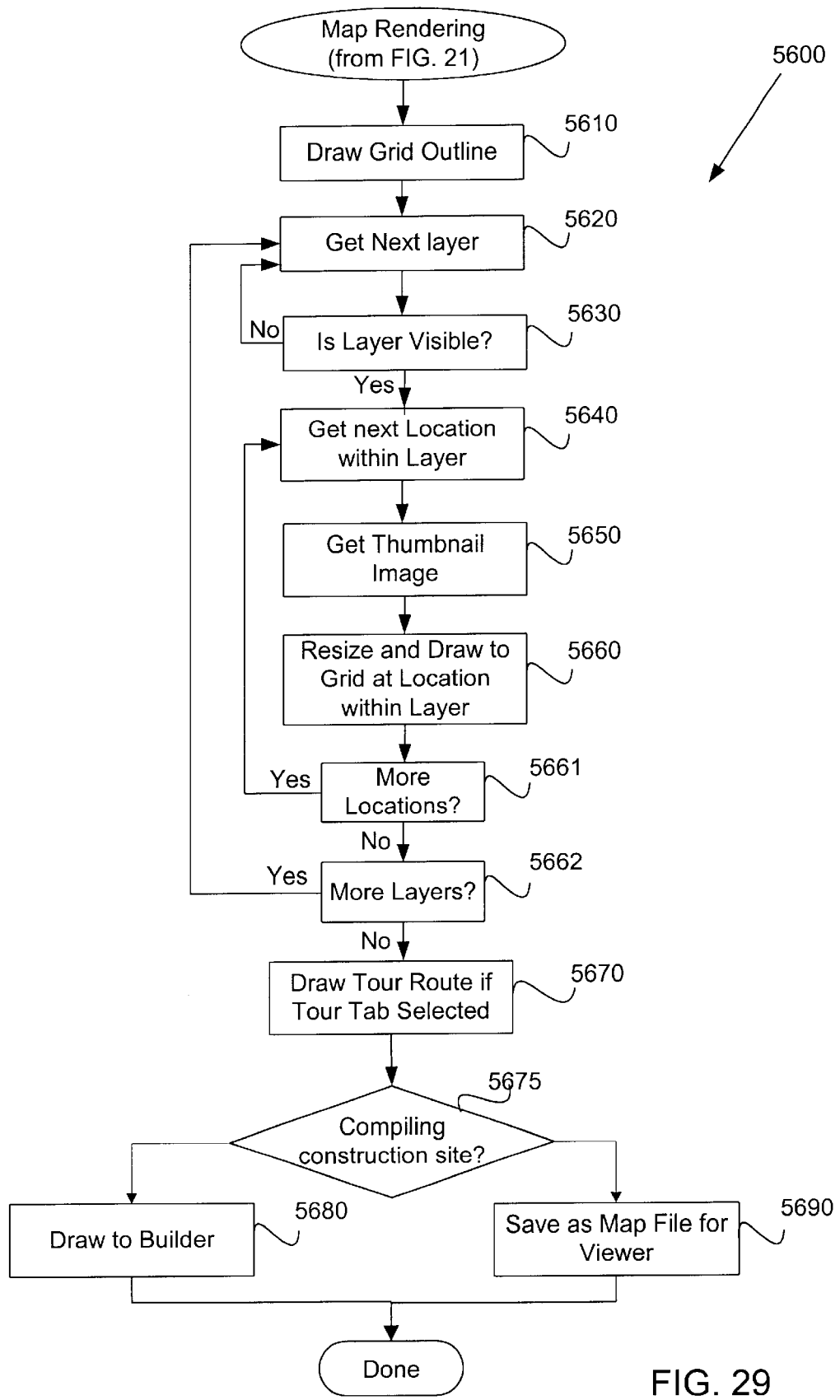
FIG. 29 is a flowchart illustrating the operation of FIG. 26 for generating the birdseye view in accordance with one embodiment of the present invention.

FIG. 29 is a flowchart illustrating the operation 5600 of FIG. 26 for generating the birdseye view in accordance with one embodiment of the present invention. A similar process may be used to generate the populated construction site displayed within the builder tool 100. Initially, a grid outline is drawn in operation 5610. The grid may be divided into any suitable number and configuration of sections or locations. In one embodiment, the grid is divided into a 16×16 array of tiles.

A first or next attribute layer is obtained in operation 5620. It is then determined whether the obtained attribute layer is visible in operation 5630. That is, some types of attribute layers (e.g., the ceiling, blocking, sound, and link layers) may be predefined as invisible so as to minimize a cluttered or restricted rendering of important objects within the birdseye view. Additionally, certain attribute layers may be selectably displayed or hidden within the construction site 601 or birdseye view of the viewer 102.

If the attribute layer is not visible, there is no need to draw attribute instances from the invisible attribute layer onto the birdseye view. Thus, if the current attribute layer is not visible, operation 5620 is repeated and a next attribute layer is obtained. Visibility of particular attribute layers depends on whether a palette associated with the particular attribute layer is selected and/or whether a corresponding display button (e.g., the link display button 624) or any other type of selection mechanism is selected to display or hide the particular attribute layer.

If the attribute layer is visible, a next or current location is obtained in operation 5640. A thumb nail image that will be displayed within the birdseye view is then obtained in operation 5650. The thumb nail image represents the attribute instance that is associated with the obtained location. The thumb nail image may be any suitable representation. For example, it may be a reduced version of the image of the attribute instance that was selected from the palette and placed within the construction site. Alternatively, it may be in the form of a representative icon for the particular attribute instance, such as a musical note representing a sound object.

After the thumb nail image is obtained, it is then resized and drawn to fit within the grid at the particular location in operation 5660. In one embodiment, if other locations within the birdseye view or construction site 601 have the same thumb nail image or attribute instance, the resized thumbnail image is also drawn within the other locations. It is then determined whether there are any more locations in operation 5661. If there are more locations, a next location is obtained in operation 5640, and a thumb nail image is obtained for the next location in operation 5650. The thumb nail image is then resized and drawn at the next location in operation 5660. Operation 5640 through 5660 are repeated for any remaining locations for the current layer.

When there are no more locations within the current layer, it is then determined whether there are any more layers in operation 5662. If there are more layers, a next layer is obtained in operation 5620, and 5630 through 5660 are repeated for the obtained next layer.

If the tour tab is selected and a tour route is being generated, the tour route is drawn within the birdseye view or construction site in operation 5670. After any tour routes are drawn over the thumbnail images of the birdseye view or construction site, it is then determined whether a populated construction site is being compiled in operation 5675.

As described above, this process 5600 may be used to display the populated construction site 601 within the builder 100, and it may also be used to display the birdseye view map within the viewer 102. If the populated construction site is being compiled for immediate use by the viewer 102, it may be appropriate to generate a birdseye view in operation 5690. Alternatively, the viewer 102 may generate the birdseye view based on information within the data structure 106. If the populated construction site is not being compiled, the populated construction site 601 is drawn within the builder 100 in operation 5680.

Turning back to FIG. 26, after the image layers and the single images have been processed and validated, respectively, one or more color palettes are constructed for the image file in operation 5080. Alternatively, color palettes may be constructed by the viewer 102 during rendering of the 3D world.

FIG. 30 is a flowchart illustrating the operation 5080 of FIG. 26 for constructing the color palette in accordance with one embodiment of the present invention. Initially, it is determined which image files will have separately or collectively generated palettes in operation 5082.

A palette may be generated for each image file, a plurality image files, or all of the image files. In general terms, the palette will include an optimal selection of colors based on the colors used within the associated image files. By way of example, the palette may include 256 colors that are selected from the most frequently used colors within the image files. That is, if the image files are rendered in 16 bit color, a 256 color palette may be automatically generated by process 5080.

Of course, each palette may include any number of colors. By reducing the number of colors that are used by the image files, the transmission speed for the images files may be significantly reduced. Additionally, memory space and rendering speed may also be reduced when the image files and associated color palettes are used to generate the 3D world.

After the image files are determined for each palette, a first or next palette is then instantiated in operation 5083. A histogram of RGB values is then constructed from the images associated with the current palette in operation 5084. A palette is then created based on the histogram in operation 5086. Any suitable technique may be implemented for analyzing the images associated with the current palette to determine what colors to include within the palette. For example, a Median Cut Quantization process may be implemented.

The palette is then applied to the designated image files in operation 5088. That is, the colors within the image files are converted into colors present within the associated palette. However, this may not be necessary if the number of colors within the image file are equal to or less than the number of colors within the palette.

The generated palette is then stored in operation 5090. For example, the palette may be stored in a file referenced by the data structure. It is then determined whether there are any more palettes to construct in operation 5092. If there are more palettes, operation 5083 through 5090 are repeated. If there are no more palettes, the process ends.

FIG. 31 is a flowchart illustrating the operation 5100 of FIG. 25 for processing non-image data. Initially, the attribute layers are processed in operation 5110. The non-image attribute layers may include any executable objects, such as sound objects, web links, and links to other data structures. The non-image attribute layers may also include video objects. General data is then validated in operation 5150. For example, a ceiling height may be based on a height of the tallest wall object.

Figure 32:
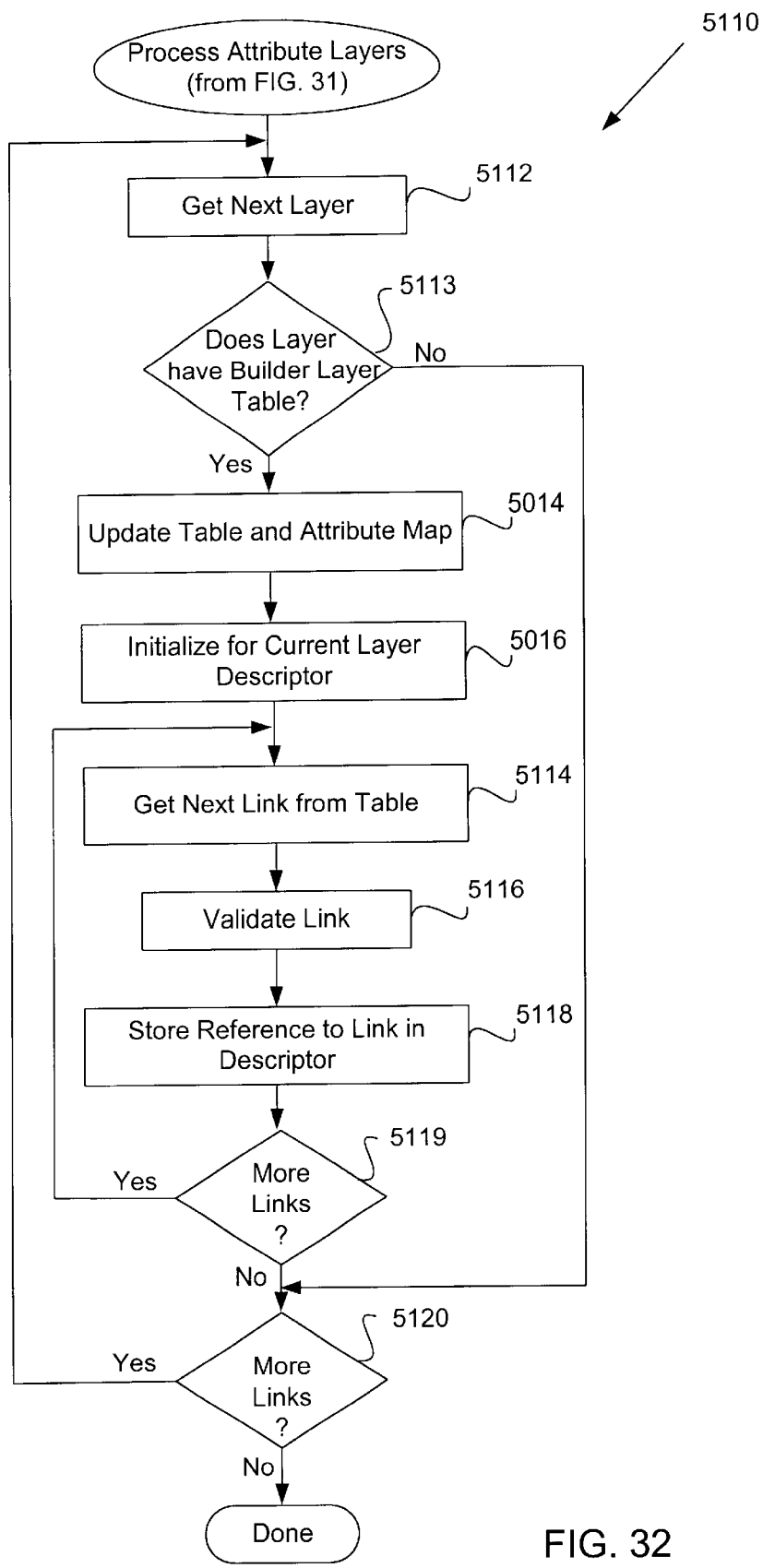
FIG. 32 is a flowchart illustrating the operation of FIG. 31 for processing the attribute layer in accordance with one embodiment of the present invention.

FIG. 32 is a flowchart illustrating the operation 5100 of FIG. 31 for processing the attribute layer. Initially, a first or next attribute layer is obtained in operation 5112. It is then determined whether the obtained attribute layer has an associated builder layer table in operation 5113 (e.g., wall height does not have an associated builder layer table). If present, the associated builder layer table will include references to various objects (e.g., image objects, data structure or world links, URL links, and sound objects).

If an associated builder layer table is present, the layer table and its associated attribute maps are then updated in operation 5014. A descriptor is then initialized for the current attribute layer in operation 5016. A first or next link is then obtained from the layer table in operation 5114 and validated in operation 5116. For example, if the link is in the form of a URL site, it is determined whether the URL site exists. A reference to the link is then stored within the descriptor in operation 5118. The reference may be any suitable format. For example, the reference may be in the form of a file name that corresponds to an executable file, or it may be in a form of a URL name.

It is then determined whether there are any more links within the current attribute layer in operation 5119. If there are more links, the remaining links are added to the descriptor in operations 5114 through 5118. If there are no more links, it is then determined whether there are any more attribute layers in operation 5120. If there are more attribute layers, the process 5110 repeats for the remaining attribute layers. If there are no more layers, the process ends.

Figure 33:
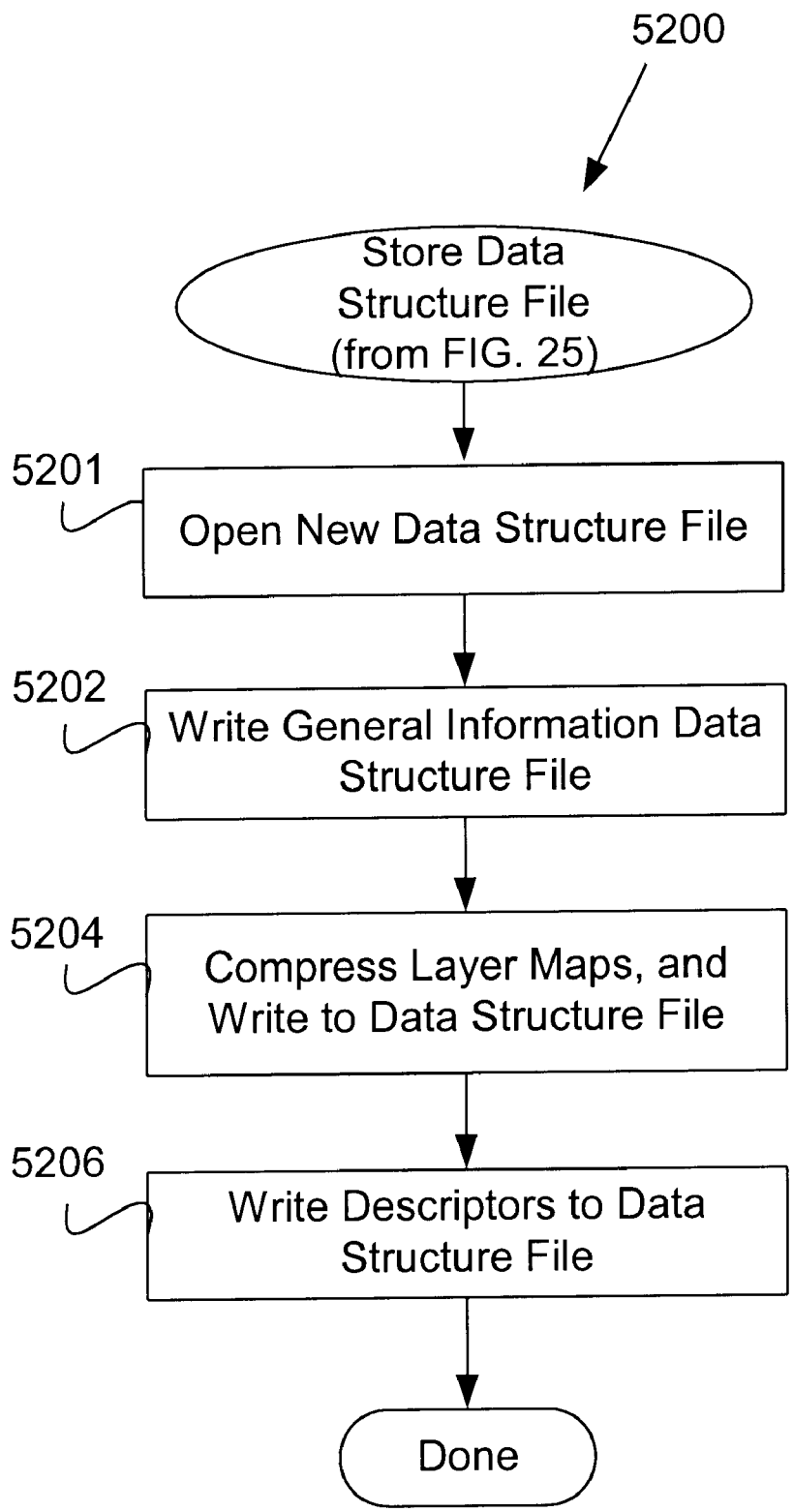
FIG. 33 is a flowchart illustrating the operation of FIG. 25 for compiling the data structure in accordance with one embodiment of the present invention.

Returning to FIG. 25, after the non-image data image is processed in operation 5100, a data structure file is compiled in operation 5200. FIG. 33 is a flowchart illustrating the operation 5200 of FIG. 25 for compiling the data structure in accordance with one embodiment of the present invention. Initially, a new data structure file is opened in operation 5201. The general information is then written into the new data structure file in operation 5202. The attribute layer maps are then compressed and written into the data structure file in operation 5204.

Any suitable techniques may be implemented for compressing the attribute layer maps. For example, a standard matrix compression technique may be implemented. During operation 5204, links from different attribute layers may be combined into one layer. Additionally, other attribute image layers may be combined. For example, the blocking attribute layer may be added to the wall attribute layer and represented as a wall image object having a height equal to zero. The generated descriptors are then written into the data structure file in operation 5206, and the process 5200 ends.

The builder 100 may be configured to allow editing of one or more palettes of attribute instances that are displayed within the attribute display window 642. Any suitable interface may be implemented within the builder to facilitate palette editing. For example, an attribute instance or attribute instance image may be dragged from a location outside of the palette (e.g., from a particular URL site) and dropped within a particular palette. Additionally, the builder may allow the same attribute instance to be cut or copied from an outside source and pasted within the particular palette.

Figure 34:
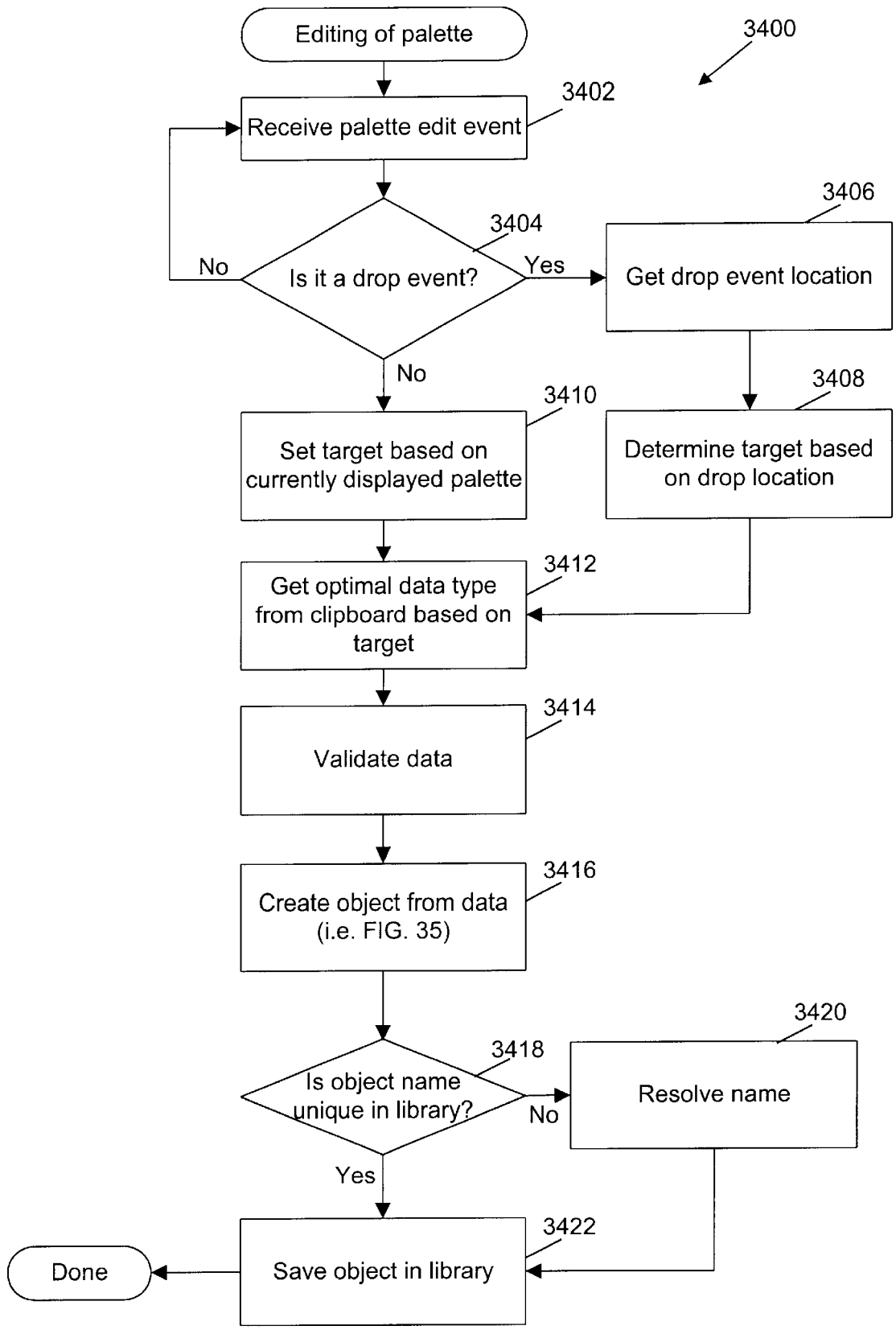
FIG. 34 is a flowchart illustrating a process for editing a particular palette of attribute instances within the builder of FIG. 1 in accordance with one embodiment of the present invention.

FIG. 34 is a flowchart illustrating a process 3400 for editing a particular palette of attribute instances within the builder of FIG. 1 in accordance with one embodiment of the present invention. Initially, a palette edit event is received in operation 3402. This palette edit event may take any suitable form (e.g., a drag and drop or a cut and paste operation as described above or a pull down menu that allows retrieval and placement of new attribute instances).

Different mechanisms used by the builder 100 to edit a selected palette may result in slightly different editing procedures. For example, a "drag and drop" event may allow the user to specify a certain area within the target palette into which the new attribute object is dropped. This feature may be useful for editing the "general" tab 620k, wherein the new attribute instance may be dropped within the background image area 656 or the emblem area 638.

As shown, after an edit event is received, it is then determined whether a "drop" event has occurred in operation 3404. If a drop event has occurred, a location is determined for the drop event in operation 3406. A target is determined based on the determined drop location in operation 3408. The target information may facilitate placement of the new attribute instance into a library that is associated with the particular drop location (e.g., a background library or an emblem library).

However, if it determined that a "drop" event has not occurred (e.g. a paste event has occurred), the target is set based on the currently selected attribute layer (e.g., floor palette) in operation 3410. If the currently selected attribute layer includes partitioned areas, a default area may be set as the target.

After the target is set, an optimal data type may then be retrieved from the clipboard in operation 3412. The clipboard may contain various data types, depending on which type of attribute instance is being pasted or dropped. For example, the clipboard may contain a link to an image. In this example, the link may be used to retrieve the image for further processing, while the link is not used for further processing.

The retrieved data is then validated in operation 3414. Validation may include any checking or editing mechanisms for ensuring that the data is valid. For example, if an image palette is the target (e.g., the floor palette), validation may ensure that a sound object is not being placed within the image palette. By way of another example, each type of attribute layer may have specific size and shape requirements for images that are associated with the attribute layer's palette. By way of a final example, if an image is too large, a editing mechanism may allow resizing of the image.

After the retrieved data is validated, an object is created based on the data in operation 3416. Any suitable type of object may be created for displaying or executing within a 3D world. For example, the created object may be in the form of an animated 3D object, a static 3D object, a sound object, or any other type of executable object.

Figure 35:
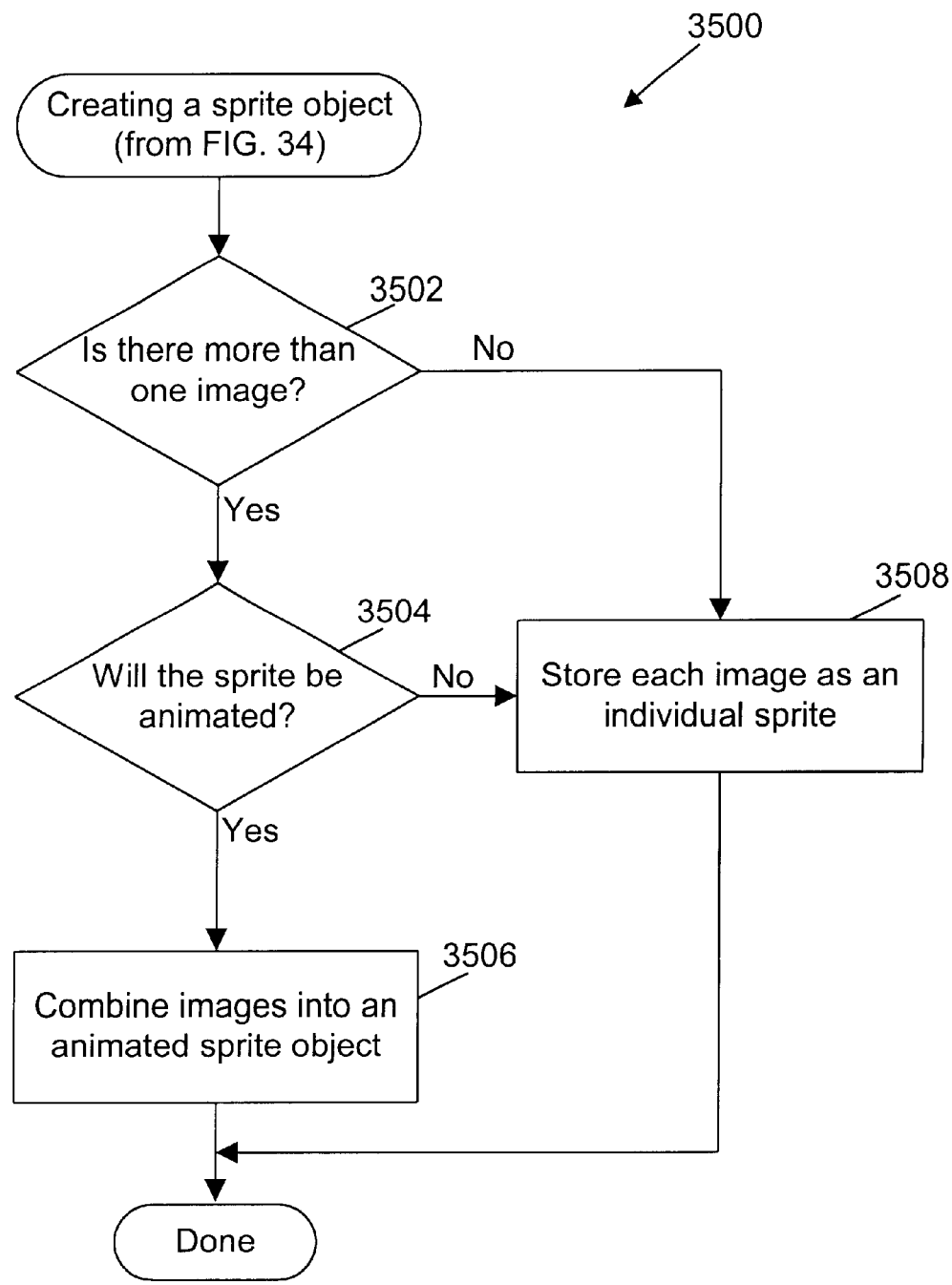
FIG. 35 is a flowchart illustrating the process of creating a sprite object in accordance with one embodiment of the present invention.

FIG. 35 is a flowchart illustrating the process 3500 of creating a sprite object in accordance with one embodiment of the present invention. In one embodiment, the builder 100 may be configured to allow the addition of a plurality of images to a selected palette. These images may be used together to create a single object or used to create separate objects based on each image within the selected palette.

Initially, it is determined whether more than one image has been dropped or pasted within the selected palette in operation 3502. If only a single image has been added to the palette, it is stored as a single sprite object. In one embodiment, the single image is used to create a single-faced sprite object that has a single face that is displayed at each viewing angle.

If, however, more than one image has been placed within the selected palette, it is then determined whether the sprite object is to be animated in operation 3504. If it is not to be animated, the images are also stored as single objects in operation 3502. In this case, each of the images may be used as a single-faced sprite object.

If the sprite image is to be animated, the images are combined into an animated sprite object in operation 3506. In one embodiment, each image is used for a particular frame or side of the sprite object. The images may be arranged in any suitable order. For example, the images may be arranged alphabetically by name. That is, the first image is used for the first displayed frame of the sprite object; the second image is used for the second frame; etc. Alternatively, the user may be given a group of thumb nail images that correspond to the placed images and asked to choose the order of the images. Animated or not, after the sprite object is created, the process 3500 for creating a sprite object then ends.

Returning to FIG. 34, after an object is created, it is then determined whether the object's name is unique within the target library in operation 3418. If the name is not unique, the name is resolved in any suitable manner for resolving name conflicts. For example, the user may be directed to choose a new name or replace the existing object having the same name with the newly created object. By way of another example, any of the image objects may include a plurality of frames, such as the floor or ceiling images. However, if the name is unique or after the name is resolved, the object is stored within the relevant library in operation 3422. The process 3400 for editing the palette then ends.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A data structure suitable for storing information useful in constructing a three dimensional representation of information via a viewable construction site that is conceptually divided into a multiplicity of locations, wherein at least a portion of the locations instance(s) and with a column of space within the three dimensional representation, wherein the population of attribute instance(s) of each construction site location correspond to different audiovisual components that are presented with the associated column of space of the three dimensional representation; and a plurality of attribute descriptors, each attribute descriptor being associated with one of the attribute maps and being arranged to reference specific attribute instances associated with the associated attribute map.

2. A data structure as recited in claim 1, wherein each attribute map has a plurality of identifiers, wherein each identifier is associated with a specific location within the construction site and a specific attribute instance.

3. A data structure as recited in claim 2, wherein each attribute descriptor is formatted to match specific identifiers of the associated attribute map to specific attribute instances.

4. A data structure as recited in claim 3, wherein specific identifiers are matched within the descriptors to specific attribute instances located within the descriptors.

5. A data structure as recited in claim 4, wherein other specific identifiers are matched within the descriptor to specific indexes that reference specific attribute instances located outside of the descriptors.

6. A data structure as recited in claim 3, wherein specific identifiers are matched within the descriptor to specific indexes that reference specific attribute instances located outside of the descriptors.

7. A data structure as recited in claim 3, wherein specific attribute instances are in the form of specific image objects that are referenced by specific start addresses within a bitmap file, the specific image objects being displayable at specific locations within the three dimensional representation.

8. A data structure as recited in claim 1, wherein each attribute instance is selected from a group consisting of an object and a link, and the object and link each being displayable or executable within the corresponding column of space within the three dimensional representation.

9. A data structure as recited in claim 1, wherein each attribute instance is selected from a group consisting of an image object, a video object, a sound object, a sprite object, an executable object, a URL, and a link to another data structure that are each displayable or executable at the associated column of space with the three dimensional representation.

10. A data structure as recited in claim 1, wherein at least one of the attribute instances is a value that defines a characteristic of the three dimensional representation at a specific location in the construction site.

11. A data structure as recited in claim 1, further comprising general data that specifies a plurality of characteristics of the three dimensional representation of information in the viewable construction site or of the construction site.

12. A data structure as recited in claim 11, wherein a first characteristic indicates a height of the viewable construction site or of the three dimensional representation of information.

13. A data structure as recited in claim 11, wherein a first characteristic indicates whether a particular attribute instance is associated with any of the attribute maps.

14. A data structure as recited in claim 11, wherein a first characteristic indicates a default user perspective with respect to the three dimensional representation.

15. A data structure as recited in claim 14, wherein the default user perspective is selected from a group consisting of a starting position, a viewing height, a viewing direction, an environmental reaction type, and a speed of movement within the three dimensional representation.

16. A data structure as recited in claim 1, further comprising general data that specifies a two dimensional representation of information associated with the three dimensional representation.

17. A data structure as recited in claim 16, wherein the two dimensional representation is a birdseye view of the three dimensional representation.

18. A data structure as recited in claim 16, wherein the general data also specifies a viewable symbol that indicates a group to which the three dimensional representation belongs.

19. A method for generating a three dimensional representation via a viewable construction site having a plurality of sections, each section having a plurality of associated attribute layers, the method comprising:
  instantiating a new construction site associated with the three dimensional representation, wherein each section within the new construction site corresponds to a column of space within the three dimensional representation;
  selecting a first attribute layer from the plurality of attribute layers that corresponds to a plurality of columns of space within the three dimensional representation, wherein the plurality of layers associated wit a particular section of the construction site corresponds to different audiovisual components that are presented within the associated column of space of the three dimensional representation;
  displaying a first palette that includes a first plurality of attribute instances associated with the fist attribute layer;
  selecting a first attribute instance from the first palette; and
  painting the first attribute instance on one or more sections of the construction site, wherein the painted on first attribute instances will be presented within the corresponding columns within the three dimensional representation.

20. A method as recited in claim 19, further comprising:
  selecting a second attribute layer that corresponds to the same plurality of columns of space within the three dimensional representation as the first attribute layer;
  displaying a second palette that includes a second plurality of attribute instances associated with the second attribute layer;
  selecting a second attribute instance from the second palette; and
  painting the second attribute instance on one or more sections of the construction site, wherein the first and second attribute instances are painted onto at least one common section, wherein the painted on second attribute instances will be presented with the corresponding one or more columns within the three dimensional representation.

21. A method as recited in claim 19, further comprising selecting a plurality of general settings for how the three dimensional representation will be displayed.

22. A method as recited in claim 20, wherein the first and second attribute instances are each selected from a different instance type selected from a group consisting of a floor image, a wall image, or a ceiling image.

23. A method as recited in claim 22, further comprising:
  selecting a third attribute layer that corresponds to the same plurality of columns of space within the three dimensional representation as the first attribute layer;
  displaying a third palette that includes a third plurality of attribute instances associated with the third attribute layer;
  selecting a third attribute instance from the second palette; and
  painting the third attribute instance on one or more sections of the construction site, wherein the third attribute instance is painted onto at least a section in common with the first or second attribute instance, wherein the painted on third attribute instances will be executed or associated with the corresponding one or more columns within the three dimensional representation.

24. A method as recited in claim 23, wherein the third attribute instance is selected from an instance type selected from a group consisting of a web link, a link to another three dimensional representation, and an executable object.

25. A method as recited in claim 24, wherein the executable audiovisual object is a computer video clip.

26. A computer readable medium containing program instructions for generating a three dimensional representation via a viewable construction site having a plurality of sections, each section having a plurality of associated attribute layers, comprising:
  computer readable code for instantiating a new construction site associated with the three dimensional representation, wherein each section within the new construction site corresponds to a column of space within the three dimensional representation;
  computer readable code for allowing selection of a first attribute layer from the plurality of attribute layers that corresponds to a plurality of columns of space within the three dimensional representation, wherein the plurality of layers associated with a particular section of the construction site corresponds to different audiovisual components that are presented within the associated column of space of the three dimensional representation;

computer readable code for displaying a first palette that includes a first plurality of attribute instances associated with the first attribute layer;

computer readable code for allowing selection of a first attribute instance from the first palette; and computer readable code for allowing a painting operation of the first attribute instance on one or more sections of the construction site, wherein the painted on first attribute instances will be presented within the corresponding columns within the three dimensional representation; and a computer readable medium that stores the computer codes.

27. A computer readable medium as recited in claim 26, further comprising:

computer readable code for allowing selection of a second attribute layer that corresponds to the same plurality of columns of space within the three dimensional representation as the first attribute layer;

computer readable code for displaying a second palette that includes a second plurality of attribute instances associated with the second attribute layer;

computer readable code for allowing selection of a second attribute instance from the second palette; and computer readable code for allowing a painting operation of the second attribute instance on one or more sections of the construction site, wherein the first and second attribute instances may be painted onto at least one common section; and computer readable code for presenting the painted on second attribute instances within the corresponding one or more columns within the tree dimensional presentation.

28. A computer readable medium as recited in claim 27, wherein the first and second attribute instances are each selected from a different instance type selected from a group consisting of a floor image, a wall image, or a ceiling image.

29. A computer readable medium as recited in claim 28, further comprising:

computer readable code for allowing selection of a third attribute layer that corresponds to the same plurality of columns of space within the three dimensional representation as the first attribute layer;

computer readable code for displaying a third palette that includes a third plurality of attribute instances associated with the third attribute layer;

computer readable code for allowing selection of a third attribute instance from the second palette;

computer readable code for painting the third attribute instance on one or more sections of the construction site, wherein the third attribute instance may be painted onto at least a section in common with the first or second attribute instance; and computer readable code for executing or associating the painted on third attribute instances within the corresponding one or more columns within the three dimensional representation.

30. A computer readable medium as recited in claim 29, wherein the third attribute instance is selected from an instance type selected from a group consisting of a web link, a link to another three dimensional representation, and an executable object.

* * * * *